US012772385B2

(12) United States Patent
Wang et al.

(10) Patent No.: US 12,772,385 B2
(45) Date of Patent: Oct. 20, 2026

(54) CIRCUIT BOARD STRUCTURE AND MANUFACTURING METHOD THEREOF

(71) Applicant: Unimicron Technology Corp., Taoyuan City (TW)

(72) Inventors: Chin-Sheng Wang, Taoyuan City (TW); Ra-Min Tain, Hsinchu County (TW); Chih-Kai Chan, Taoyuan City (TW); Shih-Lian Cheng, New Taipei City (TW)

(73) Assignee: Unimicron Technology Corp., Taoyuan City (TW)

( * ) Notice: Subject to any disclaimer, the term of this patent is extended or adjusted under 35 U.S.C. 154(b) by 241 days.

(21) Appl. No.: 18/404,845

(22) Filed: Jan. 4, 2024

(65) Prior Publication Data

US 2024/0414850 A1 Dec. 12, 2024

Related U.S. Application Data

(60) Provisional application No. 63/471,273, filed on Jun. 6, 2023.

(30) Foreign Application Priority Data

Nov. 7, 2023 (TW) ................................ 112142743

(51) Int. Cl.
*H05K 1/09* (2006.01)
*H05K 1/11* (2006.01)
(Continued)

(52) U.S. Cl.
CPC ............. *H05K 3/188* (2013.01); *H05K 1/092* (2013.01); *H05K 1/111* (2013.01); *H05K 3/0044* (2013.01);
(Continued)

(58) Field of Classification Search
CPC .......... H05K 1/092; H05K 1/111; H05K 1/09; H05K 1/11; H05K 2201/0183;
(Continued)

(56) References Cited

U.S. PATENT DOCUMENTS

2023/0309240 A1 * 9/2023 Chen .................... H05K 1/0233

FOREIGN PATENT DOCUMENTS

CN 101677068 A * 3/2010 ............. H01L 21/48
CN 109673099 A * 4/2019 ........... H05K 1/0298
(Continued)

*Primary Examiner* — Timothy J Thompson
*Assistant Examiner* — Guillermo J Egoavil
(74) *Attorney, Agent, or Firm* — JCIPRNET

(57) ABSTRACT

A circuit board structure includes a core layer, at least one electroplating metal layer, at least one dielectric layer and at least one conductive metal layer. The core layer includes at least one dielectric portion and at least one metal portion. The electroplating metal layer is disposed on at least one of a first surface and a second surface of the core layer, exposing a portion of at least one of the first surface and the second surface and at least connecting the at least one metal part. The dielectric layer is disposed on at least one of the first surface and the second surface and on the electroplating metal layer. The dielectric layer has at least one opening exposing a portion of the electroplating metal layer. The conductive metal layer is disposed in the opening of the dielectric layer and is correspondingly connected to the electroplating metal layer.

9 Claims, 18 Drawing Sheets

100a

(51) Int. Cl.
*H05K 3/00* (2006.01)
*H05K 3/02* (2006.01)
*H05K 3/18* (2006.01)
*H05K 3/34* (2026.01)
*H05K 3/3452* (2026.01)

(52) U.S. Cl.
CPC ........... *H05K 3/022* (2013.01); *H05K 3/3452* (2013.01); *H05K 2201/0183* (2013.01); *H05K 2203/0323* (2013.01)

(58) Field of Classification Search
CPC ......... H05K 2203/0323; H05K 3/0044; H05K 3/022; H05K 3/188; H05K 3/3452; H05K 3/00; H05K 3/02; H05K 3/18; H05K 3/34
USPC .......................................................... 174/256
See application file for complete search history.

(56) References Cited

FOREIGN PATENT DOCUMENTS

| | | |
|---|---|---|
| CN | 114025515 | 2/2022 |
| TW | 201611666 | 3/2016 |

* cited by examiner

CIRCUIT BOARD STRUCTURE AND MANUFACTURING METHOD THEREOF

CROSS-REFERENCE TO RELATED APPLICATION

This application claims the priority benefit of provisional application No. 63/471,273, filed on Jun. 6, 2023, and Taiwan application serial no. 112142743, filed on Nov. 7, 2023. The entirety of each of the above-mentioned patent application is hereby incorporated by reference herein and made a part of this specification.

BACKGROUND

Technical Field

The disclosure relates to a substrate structure and a manufacturing method thereof, and particularly relates to a circuit board structure and a manufacturing method thereof.

Description of Related Art

In general, if a circuit board structure requires a thick copper area, a whole thick copper plate (for example, a plate with the thickness of 0.8 mm) is often used as the core board, and thus a large amount of copper material is required. Further, due to the large thickness of a thick copper plate, a longer etching time is required for the insulating area. In addition, mechanical processing is time-consuming if circuits are to be manufactured, and it is not possible to manufacture only single-sided wiring.

SUMMARY

The disclosure provides a circuit board structure and a manufacturing method thereof, which avoid time-consuming mechanical processes for manufacturing circuits and may quickly increase the thickness of copper to carry large currents.

The circuit board structure of the present disclosure includes a core layer, at least one electroplating metal layer, at least one dielectric layer and at least one conductive metal layer. The core layer has a first surface and a second surface opposite to each other, and includes at least one dielectric portion and at least one metal portion. At least one electroplating metal layer is disposed on at least one of the first surface and the second surface of the core layer, exposing a portion of at least one of the first surface and the second surface and at least connected to at least one metal portion. At least one dielectric layer is disposed on at least one of the first surface and the second surface of the core layer and on at least one electroplating metal layer. The at least one dielectric layer has at least one opening, and at least one opening exposes a portion of the at least one electroplating metal layer. At least one conductive metal layer is disposed in at least one opening of at least one dielectric layer and is correspondingly connected to at least one electroplating metal layer.

In an embodiment of the disclosure, a material of the at least one metal portion, a material of the at least one electroplating metal layer, and a material of the at least one conductive metal layer include copper.

In an embodiment of the disclosure, a thickness of the core layer is greater than or equal to 200 μm and less than or equal to 500 μm.

In an embodiment of the disclosure, a thickness of the at least one dielectric layer is greater than or equal to 50 μm and less than 300 μm.

In an embodiment of the present disclosure, the circuit board structure further includes at least one build-up metal layer and at least one solder mask layer. The at least one build-up metal layer is disposed on the at least one conductive metal layer. The at least one solder mask layer is disposed on the at least one dielectric layer. The at least one solder mask layer has at least one solder mask opening, and the at least one solder mask opening exposes a portion of at least one build-up metal layer to define at least one pad area. Each of the at least one conductive metal layer and the at least one build-up metal layer is an electroplating layer.

In an embodiment of the disclosure, the at least one dielectric portion is a plurality of dielectric portions, and the number of the at least one metal portion is one. The number of the at least one electroplating metal layer is two, and the two electroplating metal layers are respectively disposed on the first surface and the second surface of the core layer, respectively expose a portion of the first surface and a portion of the second surface, and are connected to the metal portion and at least one of the dielectric portions. The at least one dielectric layer includes two dielectric layers, which are respectively disposed on the first surface and the second surface of the core layer and on the two electroplating metal layers. Each of the two dielectric layers has the at least one opening, and the at least one opening includes a first opening and a second opening. The first opening exposes the two electroplating metal layers connected to at least one of the dielectric portions, and the second opening exposes the two electroplating metal layers connected to the metal portion. The number of the at least one conductive metal layer is two. One of the two conductive metal layers is disposed in the first opening and the second opening of one of the two dielectric layers and is connected to a corresponding one of the two electroplating metal layers. Another one of the two conductive metal layers is disposed in the first opening of another one of the two dielectric layers and connected to another corresponding one of the two electroplating metal layers. Each of the two conductive metal layers is a conductive paste layer.

In an embodiment of the disclosure, the circuit board structure further includes an electrically insulating and thermally conductive paste layer, disposed in the second opening of the another one of the two dielectric layers and connected to the another corresponding one of the two electroplating metal layers.

In an embodiment of the disclosure, the number of the at least one dielectric portion is one. The at least one metal portion includes a first metal portion and a second metal portion. The at least one opening includes a first opening and a second opening. The at least one electroplating metal layer is connected to the first metal portion, the first opening exposes a portion of the at least one electroplating metal layer, and the second opening exposes a portion of the second metal portion. The at least one conductive metal layer is disposed in the first opening and the second opening, is correspondingly connected to the at least one electroplating metal layer and the second metal portion and extends to the at least one dielectric layer.

In an embodiment of the disclosure, the circuit board structure further includes at least one build-up dielectric layer and at least one build-up metal layer. The at least one build-up dielectric layer is disposed on the at least one dielectric layer. The at least one build-up dielectric layer has at least one third opening, and the at least one third opening exposes a portion of the at least one conductive metal layer. The at least one build-up metal layer is disposed in the at least one third opening, connected to the at least one conductive metal layer and extending to the at least one build-up dielectric layer. Each of the at least one conductive metal layer and the at least one build-up dielectric layer is at least one electroplating layer.

In an embodiment of the disclosure, the circuit board structure further includes at least one solder mask layer, disposed on the at least one build-up dielectric layer. The at least one solder mask layer has at least one solder mask opening, and the at least one solder mask opening exposes a portion of the at least one build-up metal layer to define at least one pad area.

In an embodiment of the disclosure, a manufacturing method of a circuit board structure including the following steps. A core layer is provided. The core layer has a first surface and a second surface opposite to each other and includes at least one dielectric portion and at least one metal portion. At least one electroplating metal layer is electroplated on at least one of the first surface and the second surface of the core layer. The at least one electroplating metal layer exposes a portion of at least one of the first surface and the second surface and is at least connected to the at least one metal portion. At least one dielectric layer is laminated on at least one of the first surface and the second surface of the core layer and on the at least one electroplating metal layer. A drilling process is performed on the at least one dielectric layer to form at least one opening that exposes a portion of the at least one electroplating metal layer. At least one conductive metal layer is formed in the at least one opening of the at least one dielectric layer. The at least one conductive metal layer is correspondingly connected to the at least one electroplating metal layer.

In an embodiment of the disclosure, the at least one dielectric portion is a plurality of dielectric portions, and the at least one metal portion includes a metal portion, and the step of providing the core layer includes: a copper plate is provided. The copper plate has the first surface and the second surface, wherein a thickness of the copper plate is greater than or equal to 200 μm and less than or equal to 500 μm. A first half etching process is performed on the first surface of the copper plate to form a plurality of first cavities on the first surface. A first dielectric paste is filled in the first cavities. A second half-etching process is performed on the second surface of the copper plate to form a plurality of second cavities on the second surface and in communication with the first cavities to define the metal portion. The second cavities expose the first dielectric pastes. A second dielectric paste is filled in the second cavities. The second dielectric paste is connected to the first dielectric paste to define the dielectric portions.

In an embodiment of the disclosure, the step of forming the at least one conductive metal layer in the at least one opening of the at least one dielectric layer includes: at least one electroplating seed layer is formed on the at least one dielectric layer and in the at least one opening. At least one first patterned photoresist layer is formed on the at least one electroplating seed layer. The at least one first patterned photoresist layer exposes a portion of the at least one electroplating seed layer located in the at least one opening. With the at least one first patterned photoresist layer as an electroplating mask, a first metal material is electroplated on the at least one electroplating seed layer exposed by the at least one first patterned photoresist layer. The at least one first patterned photoresist layer is removed to expose the at least one electroplating seed layer and the first metal material. At least one second patterned photoresist layer is formed on the at least one electroplating seed layer, the at least one second patterned photoresist layer exposes the first metal material and a portion of the at least one electroplating seed layer. With the at least one second patterned photoresist layer as an electroplating mask, a second metal material is electroplated on the first metal material and the at least one electroplating seed layer exposed by the at least one second patterned photoresist layer. The at least one second patterned photoresist layer and the at least one electroplating seed layer thereunder are removed to expose the at least one dielectric layer and form at least one build-up metal layer and the at least one conductive metal layer that is in the at least one opening of the at least one dielectric layer and connected to the at least one build-up metal layer.

In an embodiment of the disclosure, a thickness of the at least one dielectric layer is greater than or equal to 50 μm and less than 300 μm.

In an embodiment of the disclosure, the manufacturing method for the circuit board structure further includes: at least one solder mask layer is formed on the at least one dielectric layer. The at least one solder mask layer has at least one solder mask opening, and the at least one solder mask opening exposes a portion of the at least one build-up metal layer to define at least one pad area.

In an embodiment of the disclosure, the step of forming the at least one conductive metal layer in the at least one opening of the at least one dielectric layer includes: the at least one electroplating metal layer is two electroplating metal layers, and the at least one dielectric layer is two dielectric layers. Each of the two dielectric layers has at least one opening, and the at least one opening includes a first opening and a second opening. The first opening exposes the two electroplating metal layers connected to at least one of the dielectric portions, and the second opening exposes the two electroplating metal layers connected to the metal portion. Two release films are formed on the two dielectric layers, respectively. The two release films expose portions of the two dielectric layers, respectively, and the first opening and the second opening. A conductive paste layer is filled on one of the two dielectric layers exposed by one of the two release films and in the corresponding first opening and the second opening, and on another one of the two dielectric layers exposed by another one of the two release films and in the corresponding first opening, so as to form two conductive metal layers. One of the two conductive metal layers is disposed in the first opening and the second opening of one of the two dielectric layers and is connected to a corresponding one of the two electroplating metal layers. Another one of the two conductive metal layers is disposed in the first opening of another one of the two dielectric layers and connected to another corresponding one of the two electroplating metal layers. The two release films are removed to expose the two dielectric layers.

In an embodiment of the disclosure, the manufacturing method of the circuit board structure further includes: before the two release films are removed, an electrically insulating and thermally conductive paste layer is filled in the second opening of the another one of the two dielectric layers and connected to the another corresponding one of the two electroplating metal layers.

In an embodiment of the disclosure, the manufacturing method of the circuit board structure further includes: the at least one dielectric portion is a dielectric portion, and the at least one metal portion includes a first metal portion and a second metal portion. The at least one electroplating metal layer is connected to the first metal portion. The at least one dielectric layer and at least one first copper foil layer thereon are laminated on at least one of the first surface and the second surface of the core layer and on the at least one electroplating metal layer. A drilling process is performed on the at least one dielectric layer and the at least one first copper foil layer thereon to form the at least one opening. The at least one opening includes a first opening and a second opening. The first opening exposes a portion of the at least one electroplating metal layer. the second opening exposes a portion of the second metal portion. At least one first electroplating seed layer is formed on the at least one first copper foil layer and in the first opening and the second opening. At least one first patterned photoresist layer is formed on the at least one first electroplating seed layer. The at least one first patterned photoresist layer exposes a portion of the at least one electroplating seed layer located on the at least one first copper foil layer and the at least one first electroplating seed layer located in the first opening and the second opening. With the at least one first patterned photoresist layer as an electroplating mask, a first metal material is electroplated on the at least one first electroplating seed layer exposed by the at least one first patterned photoresist layer. The at least one first patterned photoresist layer is removed to form the at least one conductive metal layer in the first opening and the second opening correspondingly connected to the at least one electroplating metal layer and the second metal portion, and extending to the at least one dielectric layer.

In an embodiment of the disclosure, the manufacturing method of the circuit board structure further includes: at least one build-up dielectric layer and at least one second copper foil layer thereon are laminated on the at least one dielectric layer and the at least one conductive metal layer. Another drilling process is performed on the at least one build-up dielectric layer and the at least one second copper foil layer thereon to form at least one third opening. The at least one third opening exposes a portion of the at least one conductive metal layer. At least one second electroplating seed layer is formed on the at least one second copper foil layer and in the at least one third opening. At least one second patterned photoresist layer is formed on the at least one second electroplating seed layer. The at least one second patterned photoresist layer exposes a portion of the at least one second electroplating seed layer located on the at least one second copper foil layer and a portion of the at least one second electroplating seed layer located in the at least one third opening. With the at least one second patterned photoresist layer as an electroplating mask, a second metal material is electroplated on the at least one second electroplating seed layer exposed by the at least one second patterned photoresist layer. The at least one second patterned photoresist layer is removed to form at least one build-up metal layer in the at least one third opening. The at least one build-up metal layer is connected to the at least one conductive metal layer and extends to the at least one build-up dielectric layer.

In an embodiment of the disclosure, the manufacturing method of the circuit board structure further includes: at least one solder mask layer is formed on the at least one build-up dielectric layer. The at least one solder mask layer has at least one solder mask opening, and the at least one solder mask opening exposes a portion of the at least one build-up metal layer to define at least one pad area.

Based on the above, in the design of the circuit board structure of the disclosure, the electroplating metal layers are connected to the metal portion of the core layer, and the conductive metal layer are connected to the electroplating metal layers through the openings of the dielectric layers, thereby forming a metal area with a certain thickness that may carry large currents. In addition, since the circuit board structure of the disclosure forms the electroplating metal layers on the core layer through electroplating, time-consuming mechanical processing may be eliminated, and it is also feasible to manufacture only a single-sided circuit.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

The embodiments of the disclosure may be understood together with the drawings, and the drawings of the disclosure are also regarded as a part of the disclosure description. It is to be understood that the drawings of the disclosure are not drawn in full scale and, in fact, the dimensions of elements may be arbitrarily increased or reduced in order to clearly illustrate the features of the disclosure.

Figure 1A:
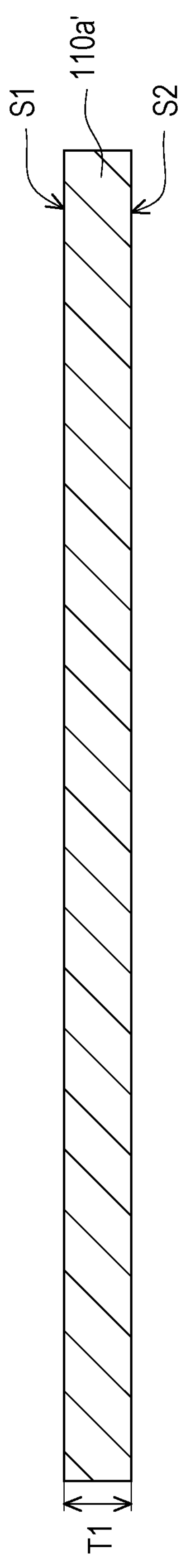
FIG. 1A to FIG. 1O are schematic drawings of a manufacturing method for a circuit board structure according to an embodiment of the disclosure.

FIG. 1A to FIG. 1O are schematic drawings of a manufacturing method for a circuit board structure according to an embodiment of the disclosure. It should be noted that FIG. 1A to FIG. 1D and FIG. 1F to FIG. 1O are schematic cross-sectional views, and FIG. 1E is a schematic top view of FIG. 1D, wherein FIG. 1D is a schematic cross-sectional view along line I-I of FIG. 1E.

Regarding the manufacturing method of the circuit board shown in the present embodiment, first, referring to FIG. 1A, a copper plate 110*a*' is provided. The copper plate 110*a*' has a first surface S1 and a second surface S2 opposite to each other, wherein the thickness T1 of the copper plate 110*a*' is, for example, greater than or equal to 200 μm and less than or equal to 500 μm. In one embodiment, the thickness T1 of the copper plate 110*a*' is, for example, 200 μm. In another embodiment, the thickness T1 of the copper plate 110*a*' is, for example, 300 μm. Here, the copper plate 110*a*' is, for example, rolled copper, and its thickness is significantly smaller than the thick copper plate in the prior art.

Figure 1B:
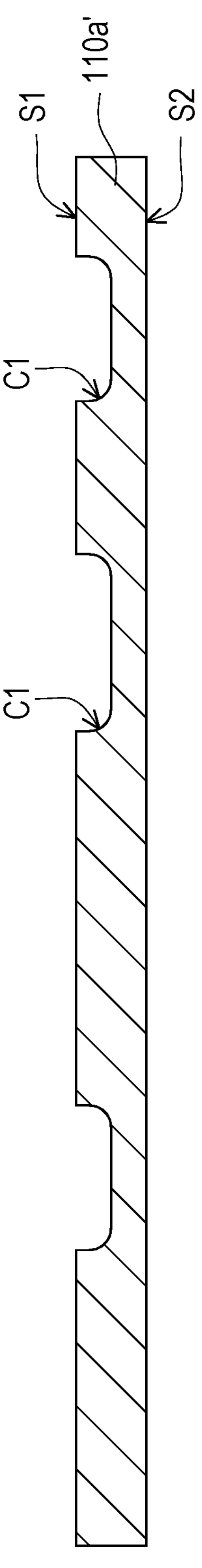

Next, referring to FIG. 1B, a first half etching process is performed on the first surface S1 of the copper plate 110*a*', and a plurality of first cavities C1 are formed on the first surface S1. The first cavities C1 are separated from each other and do not penetrate the copper plate 110*a*'.

Figure 1C:
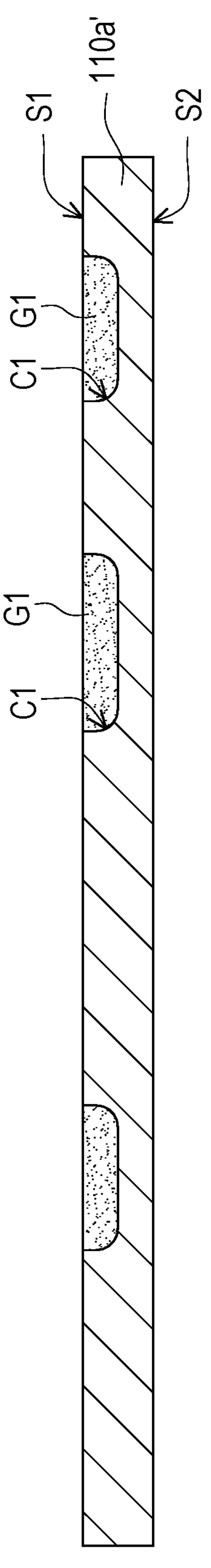
Figure 1D:
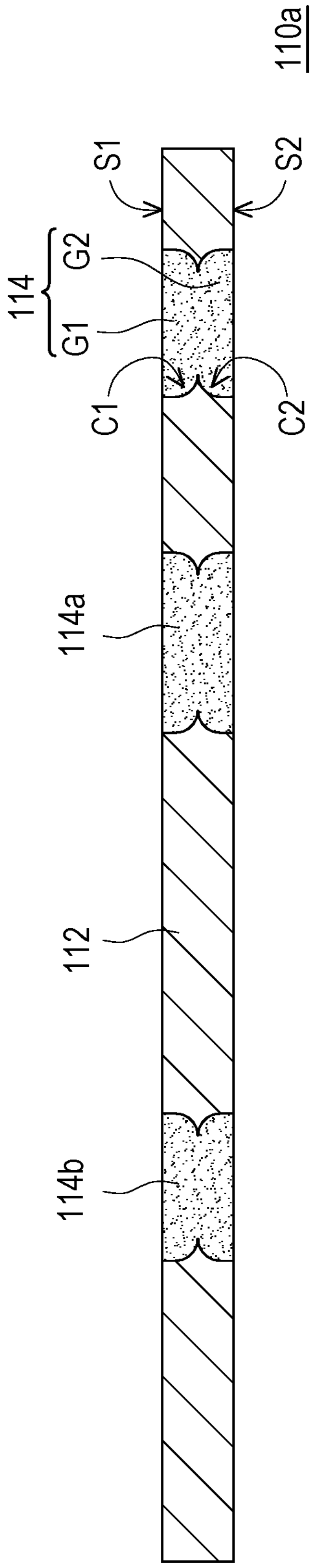
Figure 1E:
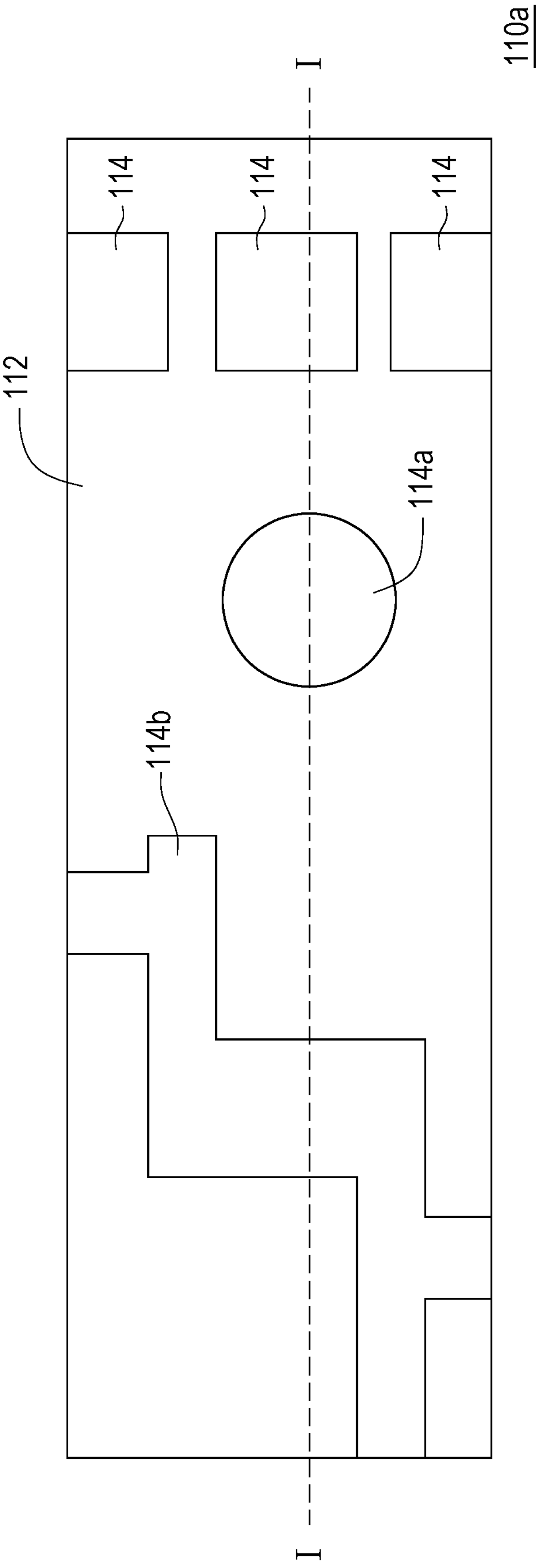

Next, referring to FIG. 1C, a first dielectric paste G1 is filled in the first cavities C1, wherein the first dielectric paste G1 completely fills the first cavities C1. In one embodiment, the surface of the first dielectric paste G1 may be flush with the first surface S1 of the copper plate 110*a*'. Here, the first dielectric paste G1 is, for example, epoxy resin, but is not limited thereto.

Next, referring to FIG. 1D, a second half-etching process is performed on the second surface S2 of the copper plate 110*a*', and a plurality of second cavities C2 in communication with the first cavities C1 is formed on the second surface S2 and defines a metal portion 112, wherein the second cavities C2 exposes the first dielectric paste G1. That is to say, the metal portion 112 is the remaining area of the copper plate 110*a*' on the copper plate 110*a*' after deducting the positions of the first cavities C1 and the second cavities C2. Therefore, the metal portion 112 is a portion of the copper plate 110*a*'.

Next, referring to FIG. 1D and FIG. 1E, a second dielectric paste G2 is filled in the second cavities C2, wherein the second dielectric paste G2 completely fills the second cavities C2. The second dielectric paste G2 is connected to the first dielectric paste G1 to define a plurality of dielectric portions 114. In one embodiment, the surface of the second dielectric paste G2 may be flush with the second surface S2 of the copper plate 110*a*'. Here, the material of the second dielectric paste G2 may be the same as the material of the first dielectric paste G1. That is, the second dielectric paste G2 is, for example, epoxy resin, but is not limited thereto. So far, the core layer 110*a* has been provided with the first surface S1 and the second surface S2 opposite to each other, and the plurality of dielectric portions 114, 114*a* and 114*b* and a metal portion 112 are included. In one embodiment, the dielectric portion 114*a* may be, for example, a dielectric hole, and the dielectric portion 114*b* can be, for example, a dielectric trench, but is not limited thereto.

Figure 1F:
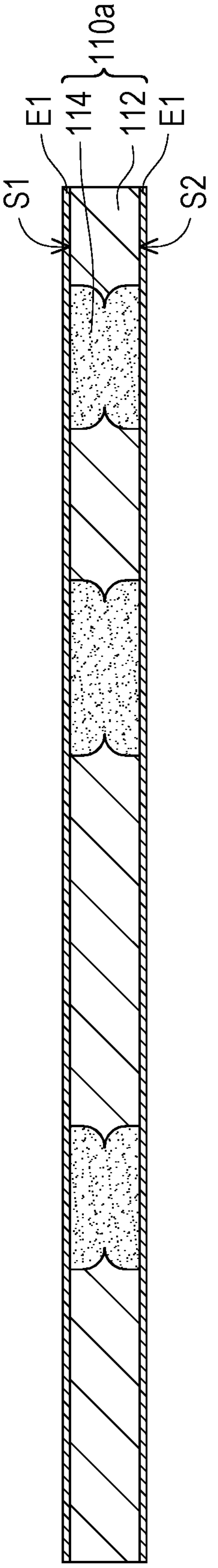

Next, referring to FIG. 1F, two electroplating seed layers E1 are respectively formed on the first surface S1 and the second surface S2 of the core layer 110*a*, which are opposite to each other, wherein the electroplating seed layers E1 covers the first surface S1 and the second surface S2 of the core layer 110*a*, respectively. Here, the material of the electroplating seed layer E1 may be, for example, titanium/copper or electro-less copper, but is not limited thereto.

Figure 1G:
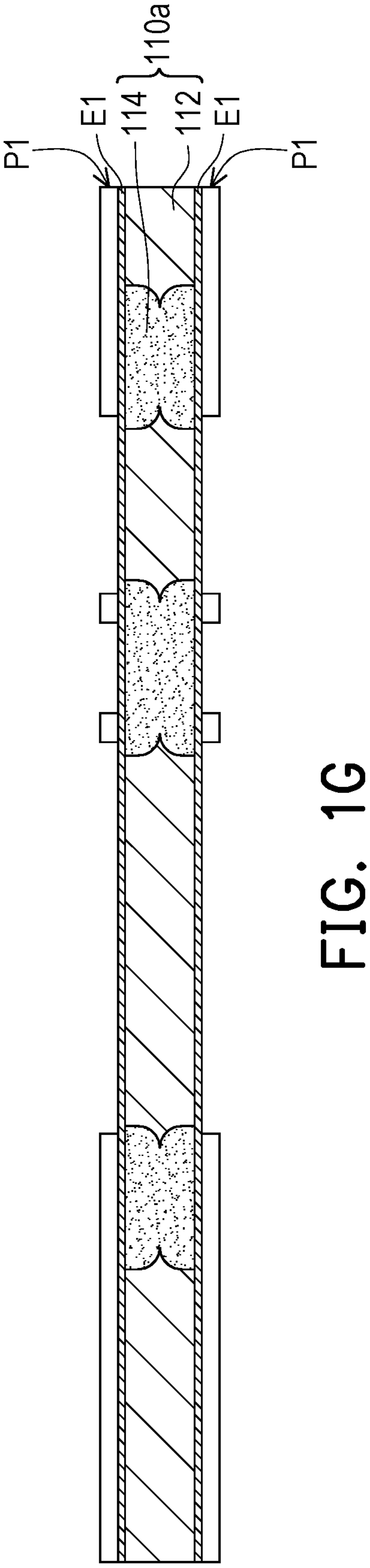

Next, referring to FIG. 1G, two patterned photoresist layers P1 are respectively formed on the two electroplating seed layers E1, wherein the two patterned photoresist layers P1 respectively expose portions of the two electroplating seed layers E1.

Figure 1H:
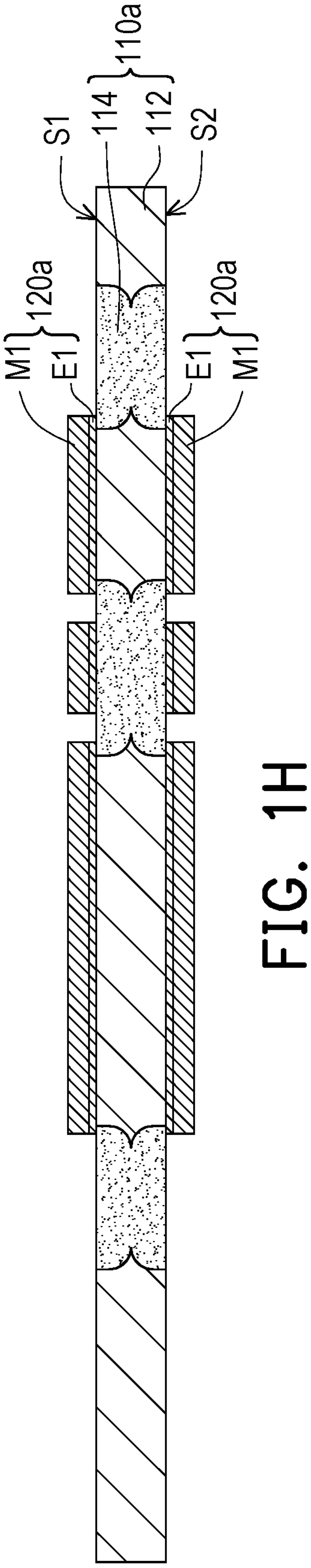

Next, referring to FIG. 1G and FIG. 1H, with two patterned photoresist layers P1 as an electroplating mask, a metal material M1 is electroplated on the electroplating seed layers E1 exposed by the two patterned photoresist layers P1. Here, the metal material M1 may be copper, for example.

Next, referring to FIG. 1H. The two patterned photoresist layers P1 are removed to expose the first surface S1 and the second surface S2 of the core layer 110*a*, thereby forming electroplating metal layers 120*a* disposed on the first surface S1 and the second surface S2 of the core layer 110*a* and at least connected to the metal portion 112. At this point, electroplating of at least one electroplating metal layer 120*a* on at least one of the first surface S1 and the second surface S2 of the core layer 110*a* has been completed.

Figure 1I:
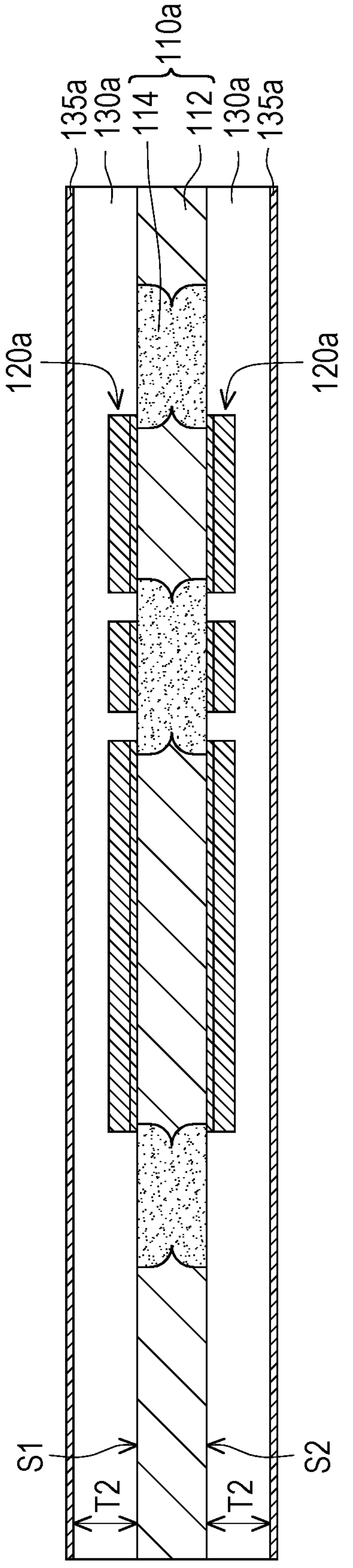

Next, referring to FIG. 1I, two dielectric layers 130*a* and copper foil layers 135*a* respectively located thereon are laminated together on the first surface S1, the second surface S2, and the two electroplating metal layers 120*a* of the core layer 110*a*. In one embodiment, the thickness T2 of each of the dielectric layers 130*a* is, for example, greater than or equal to 50 μm and less than 300 μm. Here, the thickness T2 of the dielectric layer 130*a* is, for example, 150 μm.

Figure 1J:
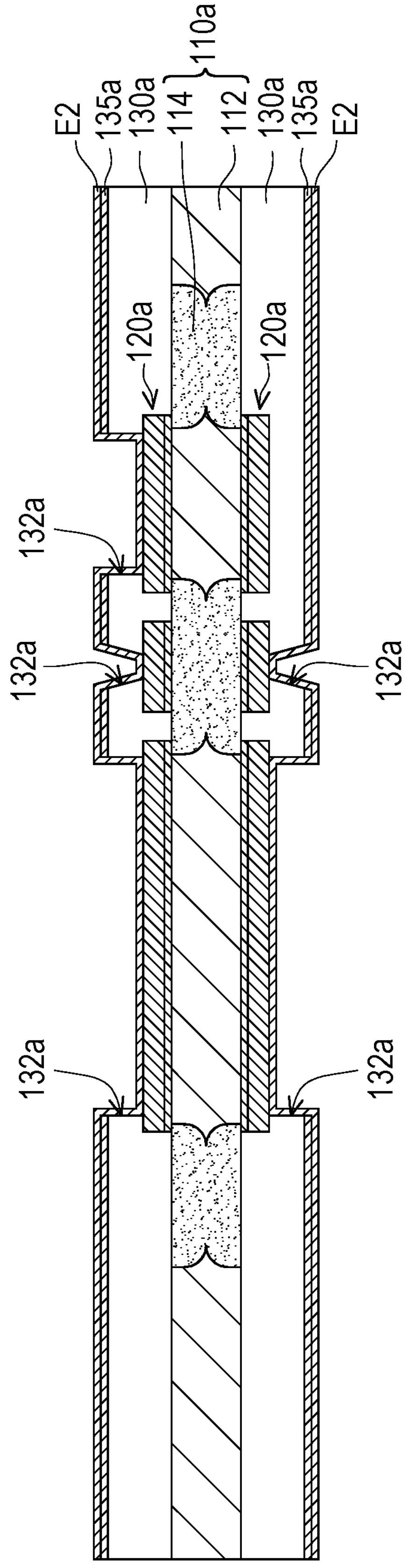

Next, referring to FIG. 1J, a drilling process is performed on the two dielectric layers 130*a* and the copper foil layers 135*a* respectively located thereon to form at least one opening on each of the two dielectric layers 130*a* (a plurality of openings 132*a* is schematically shown in the drawing). The openings 132*a* expose corresponding portions of the electroplating metal layers 120*a*. In one embodiment, the openings 132*a* may be, for example, a cavity, a blind hole, or a combination thereof. In one embodiment, the drilling process is, for example, laser drilling or mechanical drilling, but is not limited thereto.

Next, referring to FIG. 1J again, two electroplating seed layers E2 are formed on the copper foil layers 135*a* on the two dielectric layers 130*a*, respectively, and in the openings 132*a*. Here, the material of the electroplating seed layers E2 may be, for example, titanium/copper or electro-less copper, but is not limited thereto.

Next, referring to FIG. 1K again, two patterned photoresist layers P2 (i.e., the first patterned photoresist layers) are respectively formed on the two electroplating seed layers E2. The two patterned photoresist layers P2 expose portions of the electroplating layers 120*a* in the openings 132*a*.

Figure 1K:
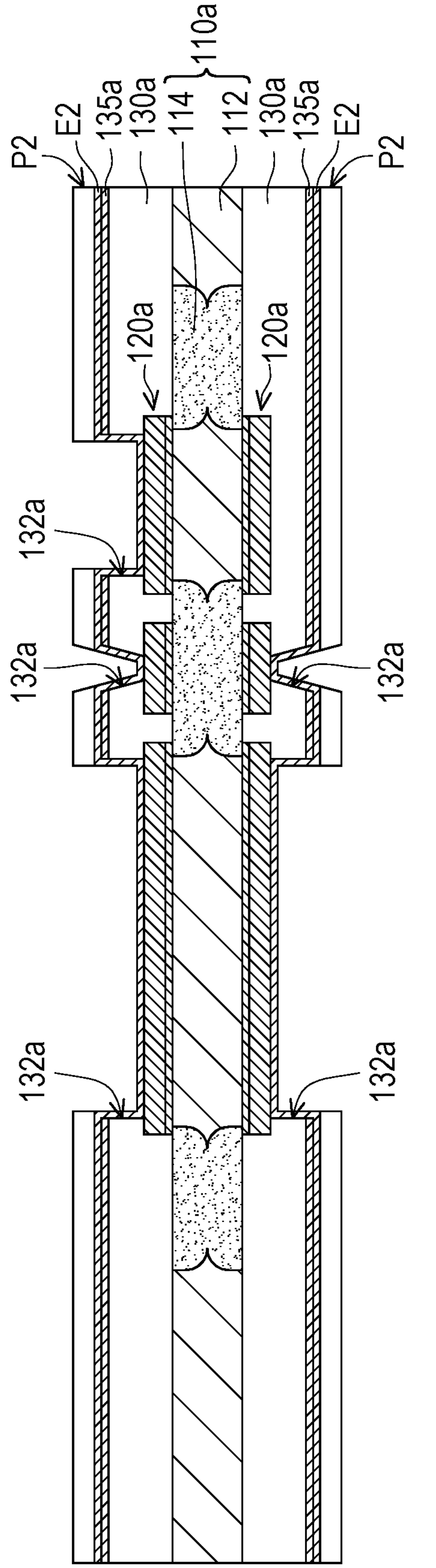
Figure 1L:
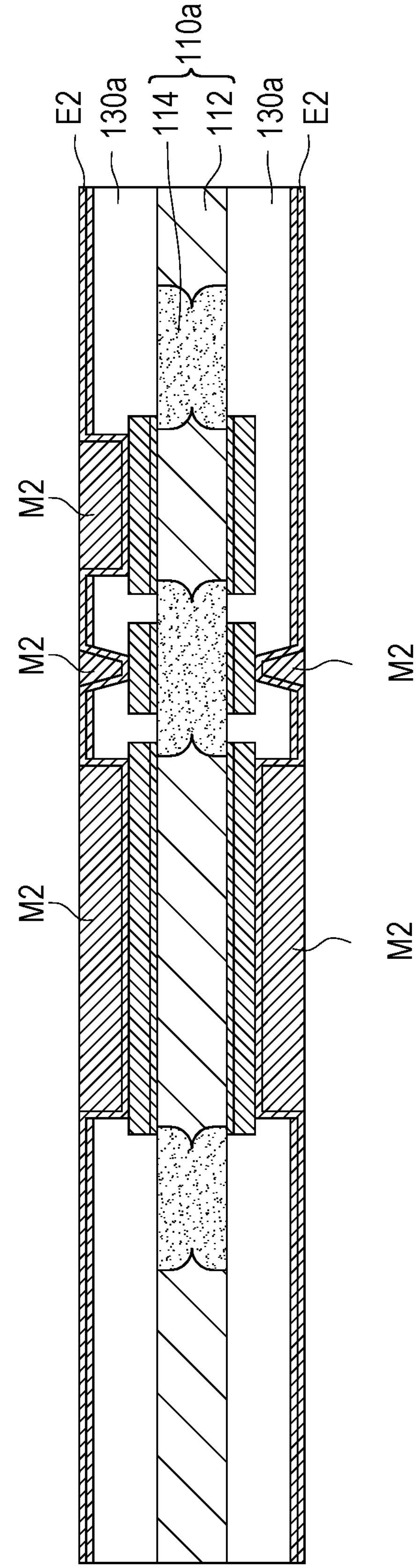

Next, referring to FIG. 1K and FIG. 1L, with the two patterned photoresist layers P2 as the electroplating mask, a metal material M2 (i.e., the first metal material) is electroplated on the electroplating seed layer E2 exposed by the two patterned photoresist layers P2. Here, the metal material M2 may be copper, for example.

Next, referring to FIG. 1K and FIG. 1L, the two patterned photoresist layers P2 are removed to expose the two electroplating seed layers E2, wherein the surface of the metal material M2 is flush with the surfaces of the two electroplating seed layers E2.

Figure 1M:
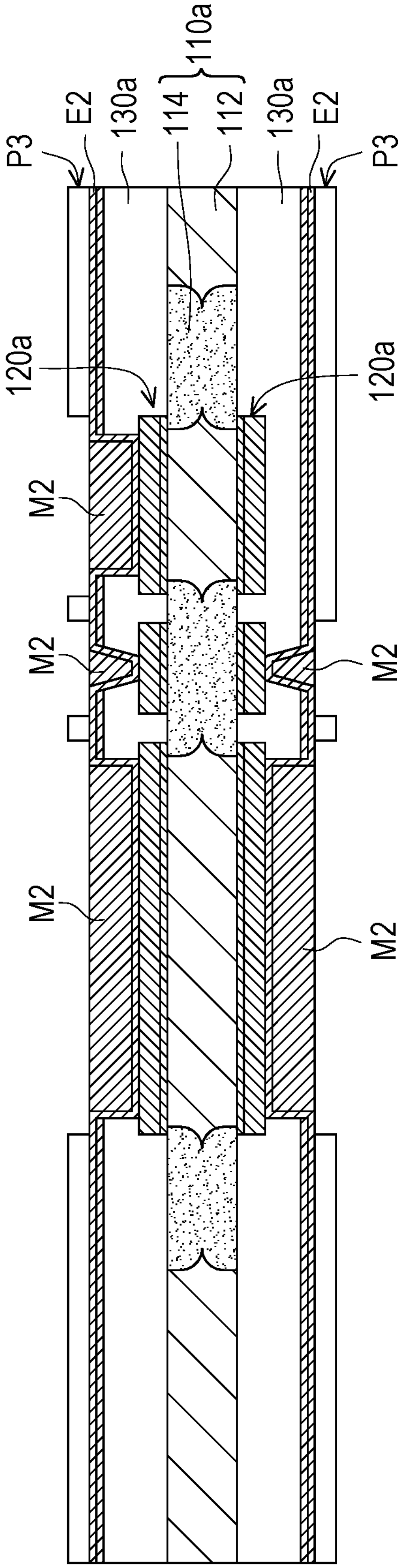

Next, referring to FIG. 1M, two patterned photoresist layers P3 (i.e., the second patterned photoresist layers) are respectively formed on the two electroplating seed layers E2. The two patterned photoresist layers P3 expose the metal material M2 and portions of the two electroplating seed layer E2.

Figure 1N:
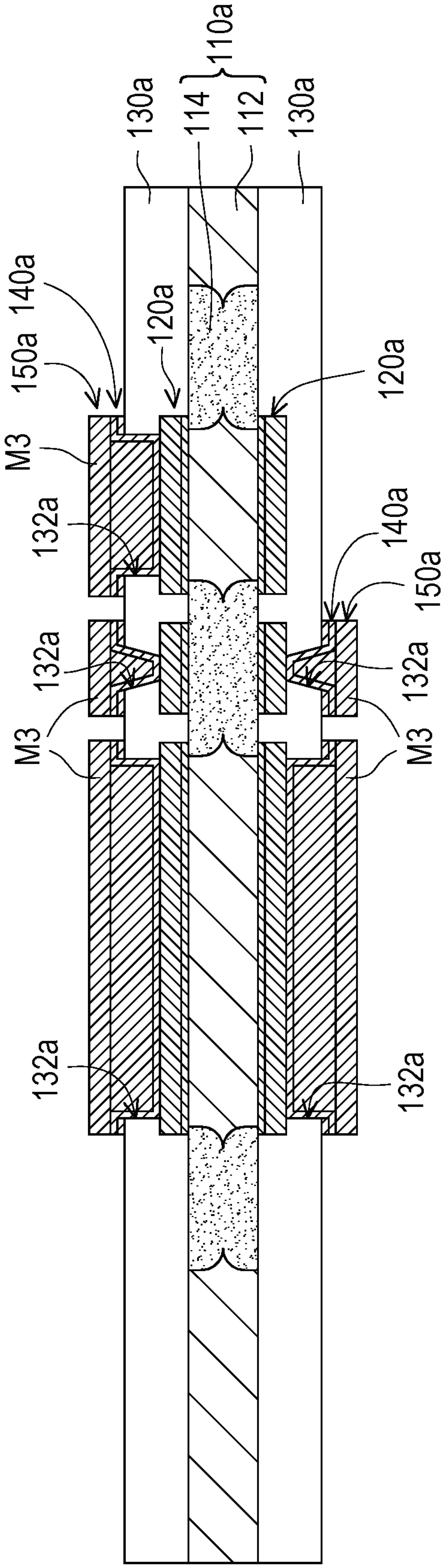
Figure 10:
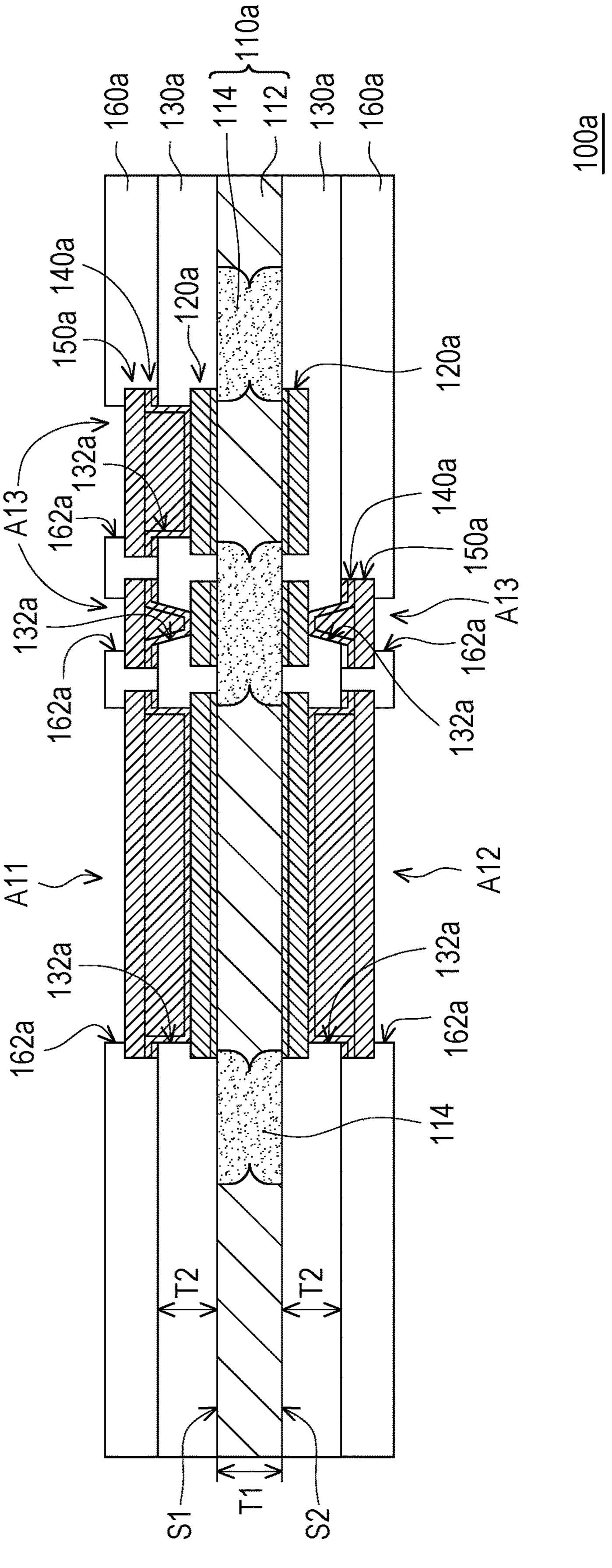

Next, referring to FIG. 1M and FIG. 1N, with the two patterned photoresist layers P3 as an electroplating mask, a metal material M3 (i.e., the second metal material) is electroplated on the metal material M2 and two electroplating seed layers E2 exposed by the two patterned photoresist layers P3. Here, the metal material M3 may be copper, for example.

After that, referring to FIG. 1M and FIG. 1N, the two patterned photoresist layers P3, the two electroplating seed layers E2 and the copper foil layers 135*a* thereunder are removed, and the two dielectric layers 130*a* are exposed to form two build-up metal layers 150*a* and the two conductive metal layers 140*a* located in the openings 132*a* of the two dielectric layers 130*a* and connected to the build-up metal layers 150*a*. That is, the two conductive metal layers 140*a* and the two build-up metal layers 150*a* are electroplating layers. So far, two conductive metal layers 140*a* have been formed in the openings 132*a* of the two dielectric layers 130*a*, respectively, and the two conductive metal layers 140*a* are respectively connected to the two electroplating metal layers 120*a*.

Finally, referring to FIG. 1O, two solder mask layers 160*a* are formed on the two dielectric layers 130*a*, respectively. Each of the solder mask layers 160*a* has at least one solder mask opening (a plurality of solder mask openings 162*a* is schematically showing in the drawing), and the solder mask openings 162*a* expose portions of the build-up metal layers 150*a* to define at least one pad area (a plurality of pad areas A11, A12, and A13 are schematically shown in the drawing). The pad areas A11 and A12, for example, are areas that may carry larger currents, and the pad area A13 is an area that may carry smaller currents, such as a signal pad. At this point, the process of manufacturing the circuit board structure 100*a* has been completed.

With regard to its structure, referring to FIG. 1O again, the circuit board structure 100*a* shown in the present embodiment includes the core layer 110*a*, the two electroplating metal layers 120*a*, the two dielectric layers 130*a* and the two conductive metal layers 140*a*. The core layer 110*a* has the first surface S1 and the second surface S2 opposite to each other, and includes the metal portion 112 and the plurality of dielectric portions 114. The two electroplating metal layers 120*a* are respectively disposed on the first surface S1 and the second surface S2 of the core layer 110, exposes a portion of the first surface S1 and a portion of the second surface S1, and is at least connected with the metal portion 112. The two dielectric layers 130*a* are respectively disposed on the first surface S1, the second surface S2 and the two electroplating metal layers 120*a* of the core layer 110*a*. Each of the dielectric layers 130*a* has the at least one opening (the plurality of openings 132*a* is schematically shown in the drawing), and the openings 132*a* expose corresponding portions of the electroplating metal layers 120*a*. The two conductive metal layers 140*a* are respectively disposed in the openings 132*a* of the two dielectric layers 130*a*, and are correspondingly connected to the two electroplating metal layers 120*a*.

In addition, the circuit board structure 100*a* shown in the present embodiment also includes the two build-up metal layers 150*a* and the two solder mask layers 160*a*. The two build-up metal layers 150*a* are respectively disposed on the two conductive metal layers 140*a*. The two solder mask layers 160*a* are respectively disposed on the two dielectric layers 130*a*. Each of the solder mask layers 160*a* has at least one solder mask opening (the plurality of solder mask openings 162*a* are schematically showed in the drawing), and the solder mask openings 162*a* expose portions of the build-up metal layer 150*a* to define the pad areas A11, A12, and A13. In the present embodiment, the material of the metal portion 112, the material of the electroplating metal layers 120*a*, and the material of the conductive metal layers 140*a* are, for example, copper. Through rapid electroplating, the electroplating metal layers 120*a* are connected to the metal portion 112 of the core layer 110*a*, and the conductive metal layers 140*a* are connected to the electroplating metal layers 120*a*, thereby forming a metal region with a certain thickness, in other words, forming a thick copper circuit board structure that may carry large currents, and having better process efficiency.

Furthermore, in the present embodiment, the core layer 110*a* is formed by half-etching the copper plate 110*a*'. The thickness T1 of the core layer 110*a* is greater than or equal to 200 μm and less than or equal to 500 μm, thereby avoiding too much copper material used. The thickness T2 of the dielectric layer 130*a* is, for example, 50 μm or more and less than 300 μm. In addition, since the circuit board structure 100*a* of this embodiment forms the electroplating metal layers 120*a*, the conductive metal layers 140*a* and build-up metal layers 150*a* on the core layer 110*a* by rapid electroplating, time-consuming mechanical processing can be eliminated.

Other embodiments will be described below for further illustration. The following embodiments adopt the reference numerals and part of the content of the previous embodiment, wherein the same reference numerals are used to represent the same or similar elements and descriptions of the same technical content are omitted. The omitted portions are as described in the embodiment above and are not repeated in the embodiments below.

Figure 2:
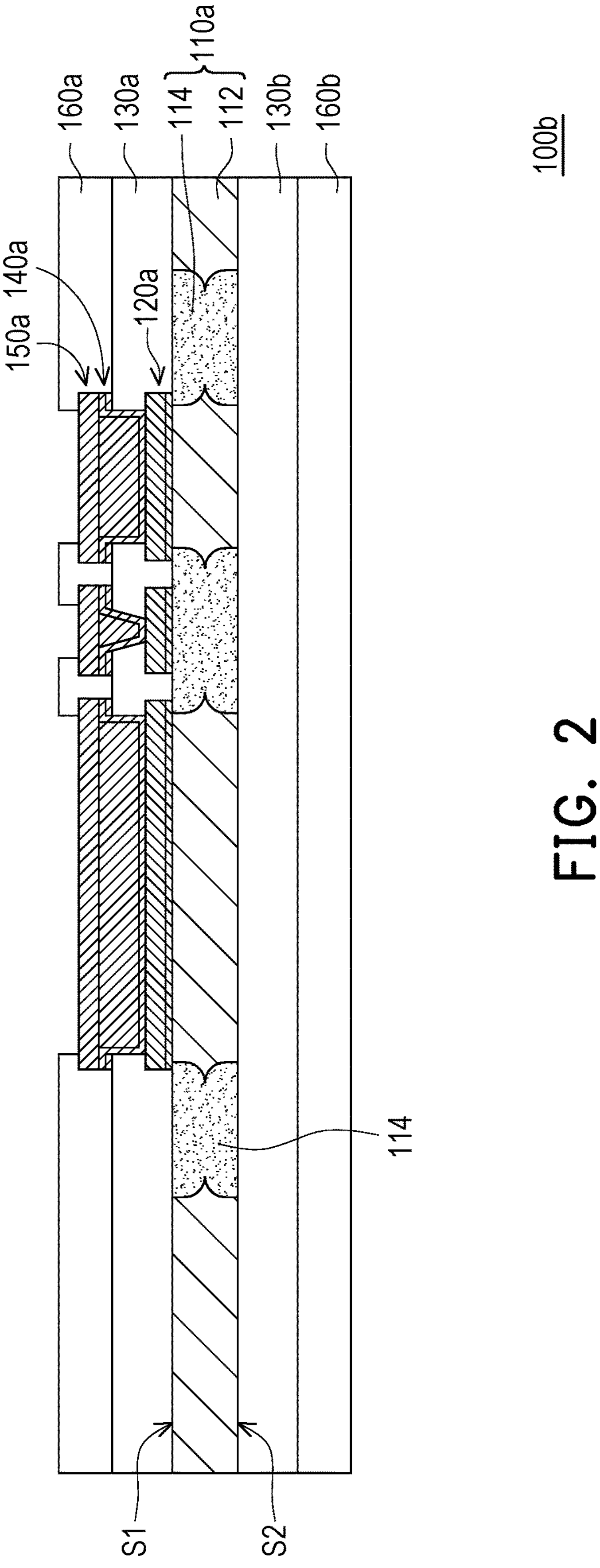
FIG. 2 is a schematic cross-sectional view of a circuit board structure according to an embodiment of the disclosure.

FIG. 2 is a schematic cross-sectional view of a circuit board structure according to an embodiment of the disclosure. Referring to FIG. 1O and FIG. 2, the circuit board structure 100*b* shown in the present embodiment is similar to the circuit board structure 100*a* in FIG. 1O, and a main difference between the two embodiments is that in the present embodiment, the electroplating metal layer 120*a*, the conductive metal layer 140*a* and the build-up metal layer 150*a* of the circuit board structure 100*b* are disposed only on the first surface S1 of the core layer 110*a*. That is, the numbers of the electroplating metal layer 120*a*, the conductive metal layer 140*a* and the build-up metal layer 150*a* are one, which means that the circuit board structure 100*b* is a single-sided circuit board. The dielectric layer 130*b* directly covers the second surface S2 of the core layer 110*a*, and the solder mask layer 160*b* covers the dielectric layer 130*b* to avoid warping caused by unbalanced structures on opposite sides of the core layer 110*a*.

FIG. 3A to FIG. 3E are schematic cross-sectional views of a manufacturing method for a circuit board structure according to another embodiment of the disclosure. The manufacturing method of the circuit board structure in the present embodiment is similar to the manufacturing method of the circuit board structure mentioned above, and a main difference between the two embodiments is that after the step shown in FIG. 1H, that is, after the electroplating metal layers 120*a* are electroplated on the first surface S1 and the second surface S2 of the core layer 110*a*, referring to FIG. 3A, two dielectric layers 130*c* are laminated on the first surface S1, the second surface S2 and the two electroplating metal layers 120*a* of the core layer 110*a*. The thickness T3 of each of the dielectric layers 130*c* is, for example, greater than or equal to 50 μm and less than 300 μm. Here, the thickness T3 of the dielectric layer 130*c* is, for example, 150 μm.

Figure 3A:
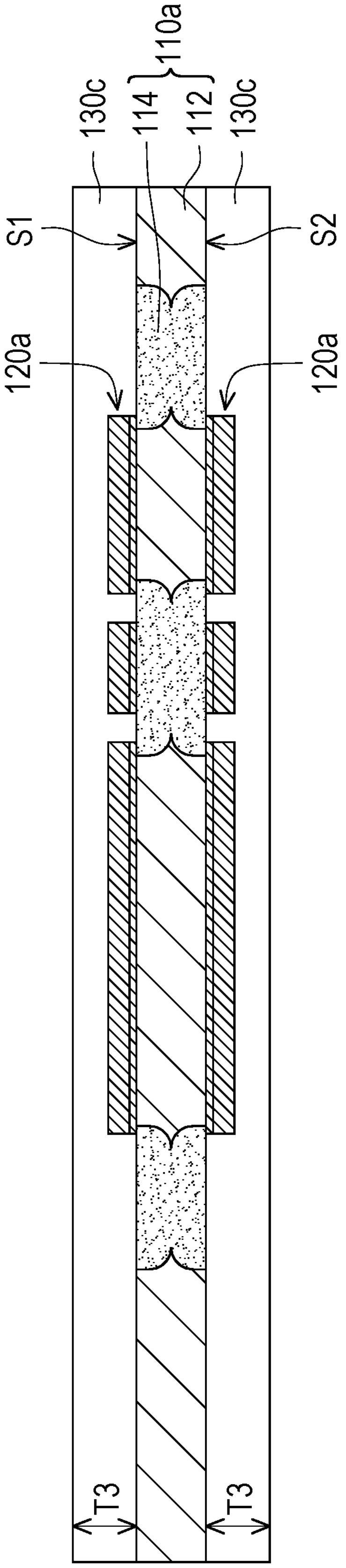
FIG. 3A to FIG. 3E are schematic cross-sectional views of a manufacturing method for a circuit board structure according to another embodiment of the disclosure.
Figure 3B:
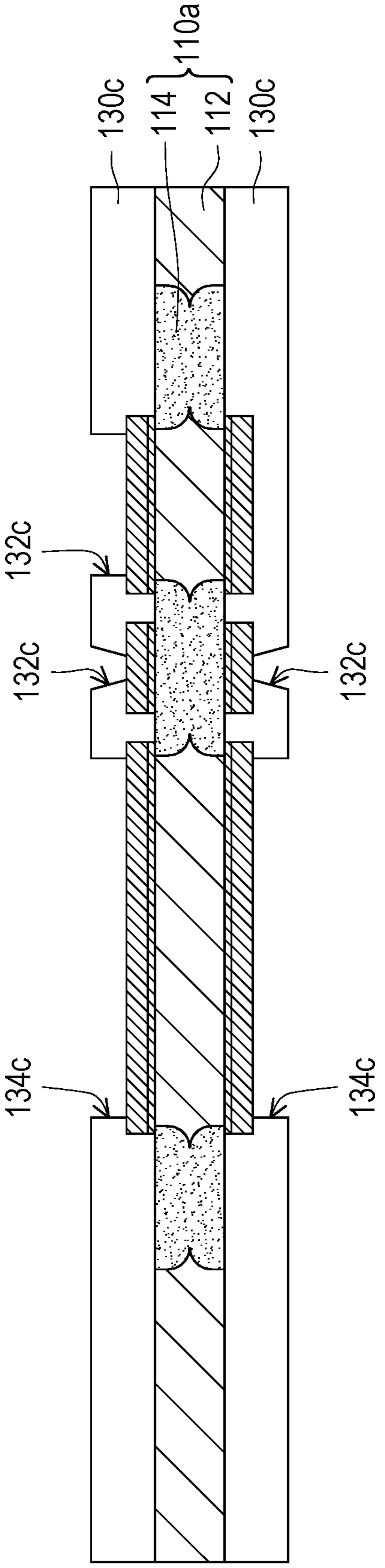

Next, referring to FIG. 3B, a drilling process is performed on the two dielectric layers 130*c* to form at least one opening on the two dielectric layers 130*c*, respectively. The at least one opening includes first openings 132*c* and second openings 134*c*. The first openings 132*c* expose two electroplating metal layers 120*a* connected to the at least one dielectric portion 114 and/or the metal portion 112, and the second openings 134*c* exposes two electroplating metal layers 120*a* connected to the metal portion 112. In one embodiment, the drilling process is, for example, laser drilling or mechanical drilling, but is not limited thereto. In one embodiment, the first openings 132*c* may be, for example, a blind hole, and the second openings 134*c* may be, for example, a cavity.

Figure 3C:
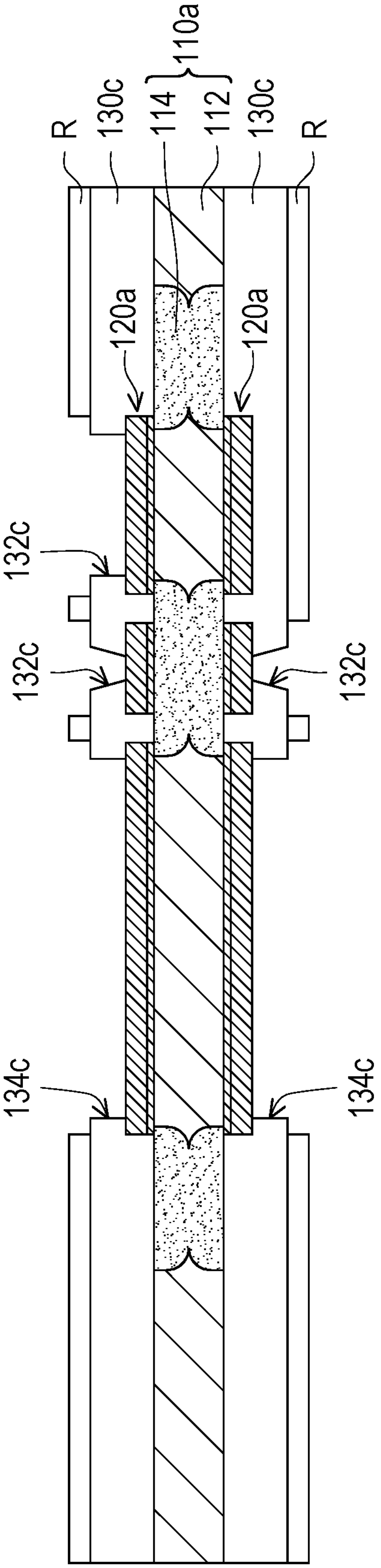

Next, referring to FIG. 3C, two release films R are formed on the two dielectric layers 130*c*, respectively. The two release films R expose portions of the two dielectric layers 130*c*, respectively, and the first openings 132*c* and the second openings 134*c*.

Figure 3D:
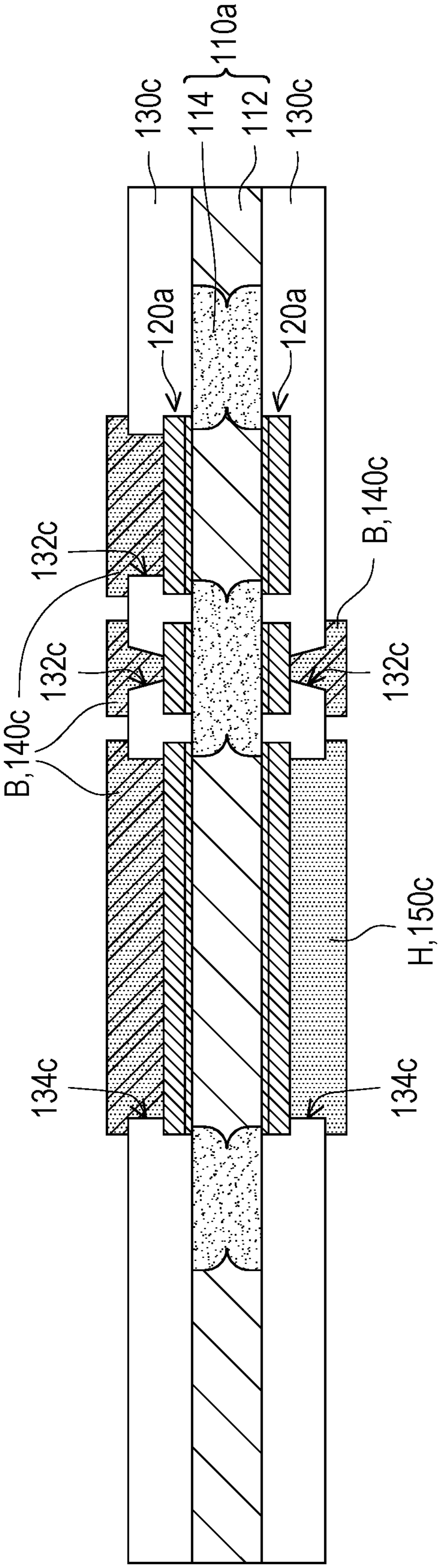

Next, referring to FIG. 3C and FIG. 3D, a conductive paste layer B is filled on one of the two dielectric layers 130*c* exposed by one of the two release films R and the corresponding first openings 132*c* and the second opening 134*c*, and on the other of the two dielectric layers 130*c* exposed by the other of the two release films R and in the corresponding first opening 132*c*, to form two conductive metal layers 140*c*. Further, one of the two conductive metal layers 140*c*

(such as the conductive metal layer 140*c* located above the core layer 110*a*) is disposed in the first openings 132*c* of one of the two dielectric layers 130*c* (such as the dielectric layer 130*c* located above the core layer 110*a*) and in the second opening 134*c*, and is connected to the corresponding one of the two electroplating metal layers 120*a* (such as the electroplating metal layer 120*a* located above the core layer 110*a*). The other of the two conductive metal layers 140*c* (such as the conductive metal layer 140*c* located below the core layer 110*a*) is disposed in the first opening 132*c* of the other of the two dielectric layers 130*c* (such as the dielectric layer 130*c* located below the core layer 110*a*) and is connected to the other corresponding one of the two electroplating metal layers 120*a* (such as the electroplating metal layer 120*a* located below the core layer 110*a*). Here, the material of the conductive paste layer B is, for example, copper paste, silver paste, solder paste or composite metal paste, wherein the thermal conductivity of the conductive paste layer B may be greater than or higher than the thermal conductivity of copper or aluminum.

Next, referring to FIG. 3D, an electrically insulating and thermally conductive paste H is filled into the second opening 134*c* of the other of the two dielectric layers 130*c* (such as the dielectric layer 130*c* located below the core layer 110*a*) and is connected with the other corresponding one of the two electroplating metal layers 120*a* (such as the electroplating metal layer 120*a* located below the core layer 110*a*) to form an electrically insulating and thermally conductive paste layer 150*c*. Here, the material of the electrically insulating and thermally conductive paste H is, for example, a composite of diamond powder, ceramic powder ($Al_2O_3$, AlN, etc.) and epoxy resin.

After that, referring to FIG. 3C and FIG. 3D, the two release films R are removed to expose the two dielectric layers 130*c*, respectively.

Figure 3E:
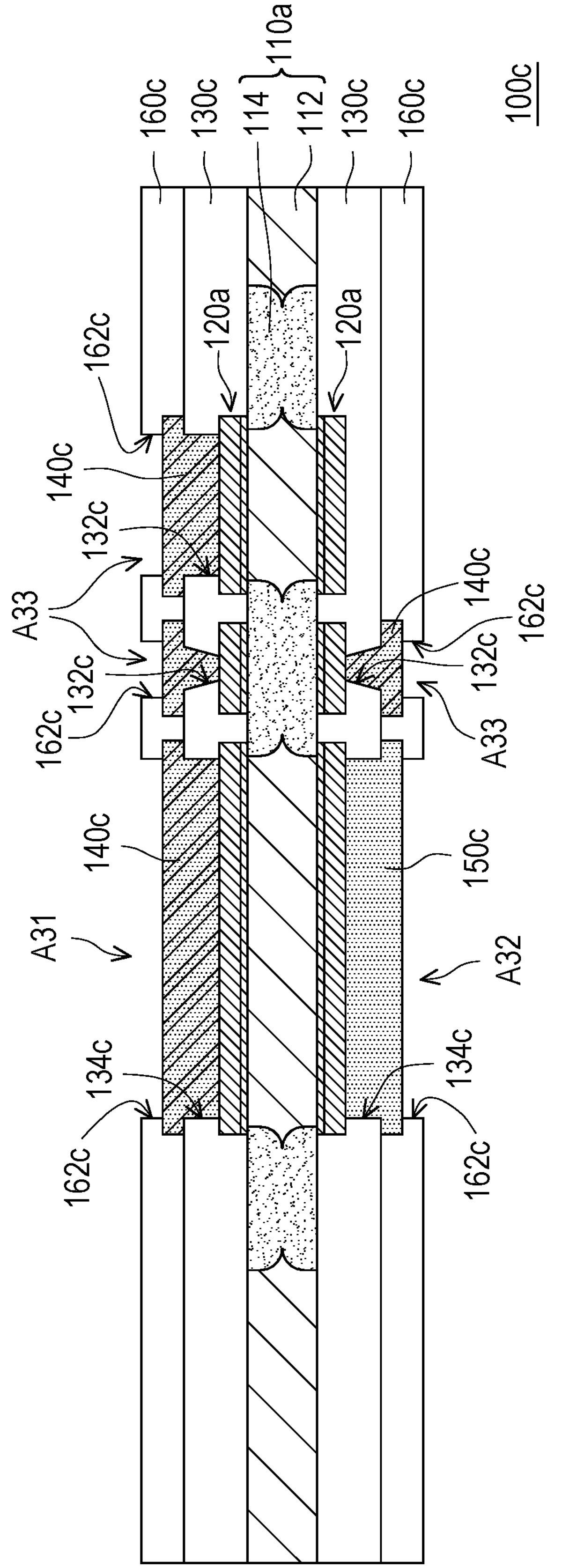

Finally, referring to FIG. 3E, two solder mask layers 160*c* are formed on the two dielectric layers 130*c*, respectively. Each of the solder mask layers 160*c* has at least one solder mask opening (a plurality of solder mask openings 162*c* is schematically showed in the drawing), and the solder mask openings 162*c* expose portions of the conductive metal layers 140*c* and a portion of the electrically insulating and thermally conductive paste layer H to define at least one pad area (a plurality of pad areas A31, A32, and A33 is schematically showed in the drawing). The pad area A31 is, for example, an area that may carry larger currents, the pad area A32 is, for example, a heat dissipation pad, and the pad area A33 is, for example, an area that may carry smaller currents, such as a signal pad. At this point, the process of manufacturing the circuit board structure 100*c* has been completed.

With regard to its structure, referring to FIG. 1O and FIG. 3E, the circuit board structure 100*c* in the present embodiment is similar to the circuit board structure 100*a* in FIG. 1O, and a main difference between the two embodiments is that the conductive metal layer 140*c* in the present embodiment is specifically a conductive paste layer, and that is, the conductive metal layer 140*c* is formed by filling with conductive paste. In addition, the circuit board structure 100*c* in the present embodiment also includes the electrically insulating and thermally conductive paste layer 150*c*, which is disposed in the second opening 134*c* of the other of the two dielectric layers 130*c* (such as the dielectric layer 130*c* located below the core layer 110*a*) and connected with the other corresponding one of the two electroplating metal layers 120*a* (such as the electroplating metal layer 120*a* located below the core layer 110*a*). In short, the circuit board structure 100*c* in the present embodiment not only serves as a thick copper circuit board that may carry large currents but also has an effect of heat dissipation.

FIG. 4A to FIG. 4J are schematic cross-sectional views of a manufacturing method for a circuit board structure according to another embodiment of the disclosure. First, referring to FIG. 4A, a core layer 110*d* is provided. The core layer 110*d* has a first surface S1' and a second surface S2' opposite to each other, and includes a dielectric portion 115, a first metal portion 117 and at least one second metal portion 119 (two second metal portions 119 are schematically shown in the drawings).

In one embodiment, the core layer 110*d* may be made of a copper foil substrate, wherein the dielectric portion 115 is, for example, a portion of the core dielectric layer of the copper foil substrate, the thickness of the core dielectric layer is, for example, 200 μm or 300 μm, but is not limited thereto. Then, a drilling process may be performed on the copper foil substrate, and holes may penetrate the upper copper foil and the core dielectric layer to expose the lower copper foil layer. Next, an electroplating seed layer is formed, a patterned photoresist layer is formed, and an electroplating process is performed, so that the first metal portion 117 and the second metal portions 119 are electroplated in the holes.

Next, referring to FIG. 4A again, two electroplating metal layers 120*d* are formed on the first surface S1' and the second surface S2' of the core layer 110*d*, wherein two of the electroplating metal layers 120*d* may be connected to opposite sides of the same first metal portion 117, respectively.

Figure 4A:
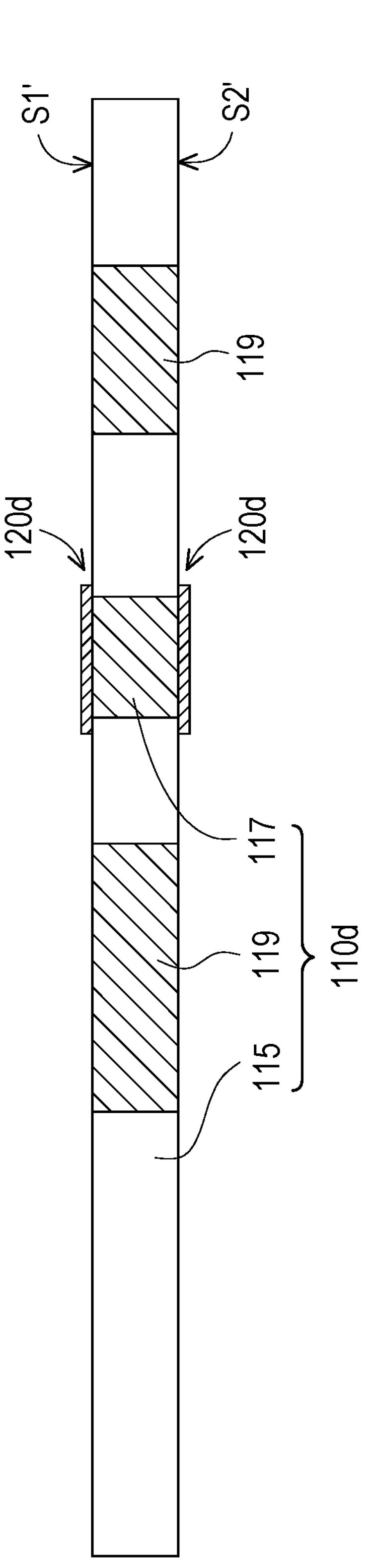
FIG. 4A to FIG. 4J are schematic cross-sectional views of a manufacturing method for a circuit board structure according to another embodiment of the disclosure.
Figure 4B:
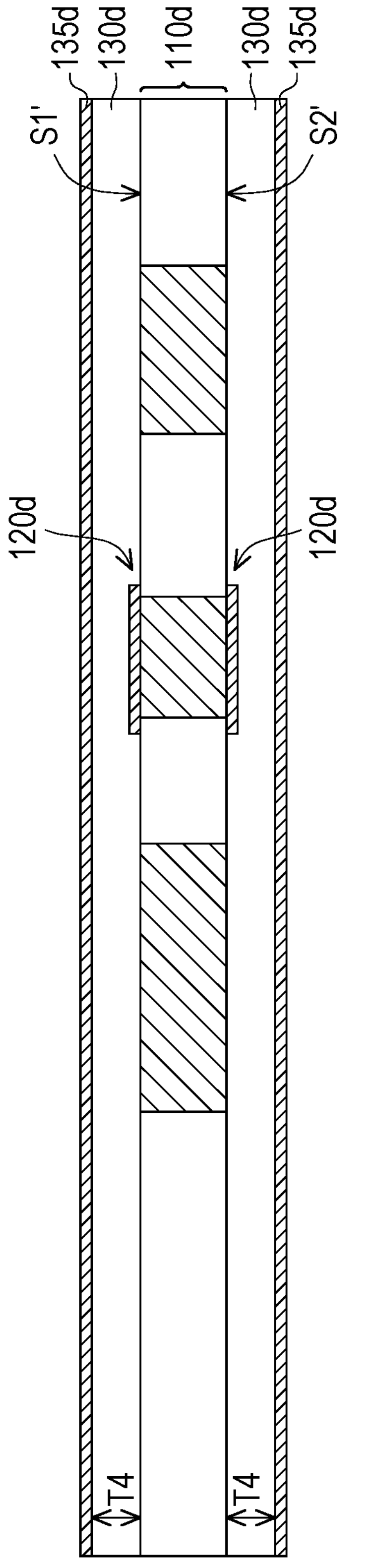

Next, referring to FIG. 4B, two dielectric layers 130*d* and two first copper foil layers 135*d* respectively located thereon are laminated on the first surface S1' and the second surface S2' of the core layer 110*d* and on the two electroplating metal layers 120*d*. The thickness T4 of the dielectric layers 130*d* is, for example, 50 μm or more and less than 300 μm. Here, the thickness T4 of the dielectric layers 130*d* is, for example, 100 μm.

Figure 4C:
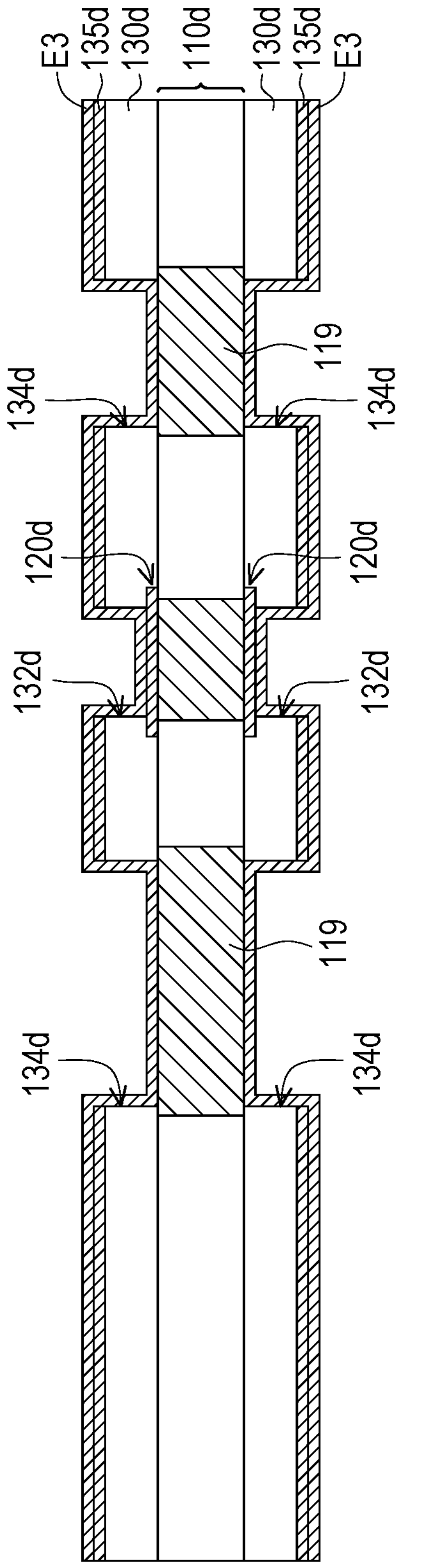

Next, referring to FIG. 4C, a drilling process is performed on the two dielectric layers 130*d* and the two copper foil layers 135*d* (i.e., the first copper foil layers) thereon to form at least one opening. The at least one opening includes first openings 132*d* and second openings 134*d*. The first openings 132*d* expose portions of at least one electroplating metal layer 120*d*. The second openings 134*d* expose portions of the second metal portions 119.

Next, referring to FIG. 4C again, two electroplating seed layers E3 (i.e., the first electroplating seed layers) are formed on the two copper foil layers 135*d*, respectively, and in the first openings 132*d* and in the second openings 134*d*.

Next, referring to FIG. 4D again, two patterned photoresist layers P4 (i.e., the first patterned photoresist layers) are formed on the two electroplating seed layers E3, respectively. The two patterned photoresist layers P4 expose portions of the two electroplating seed layers E3 located on the two copper foil layers 135*d* and portions of the two electroplating seed layers E3 located in the first openings 132*d* and the second openings 134*d*.

Figure 4D:
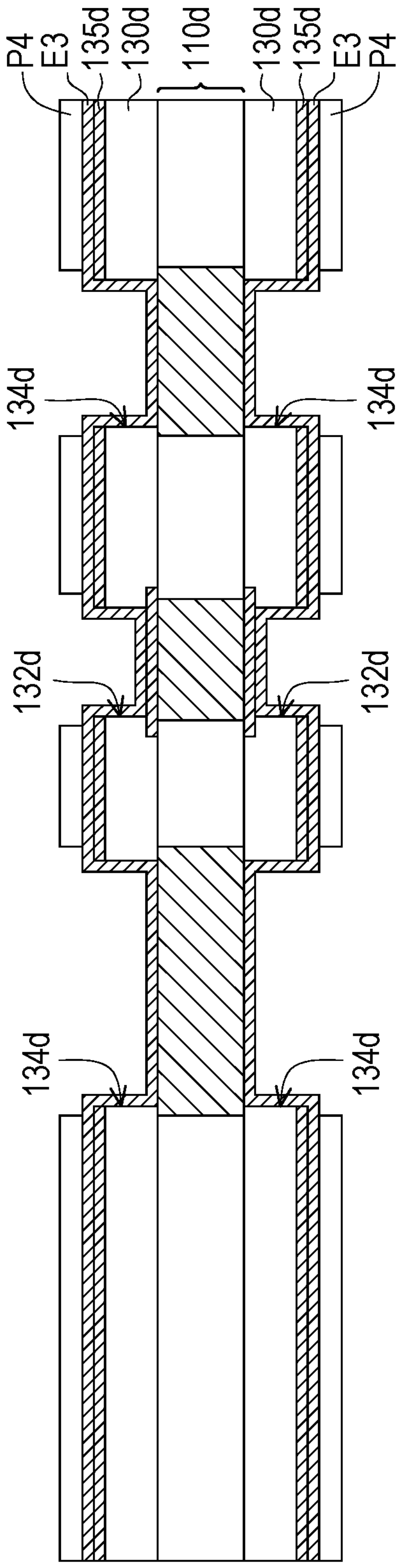
Figure 4E:
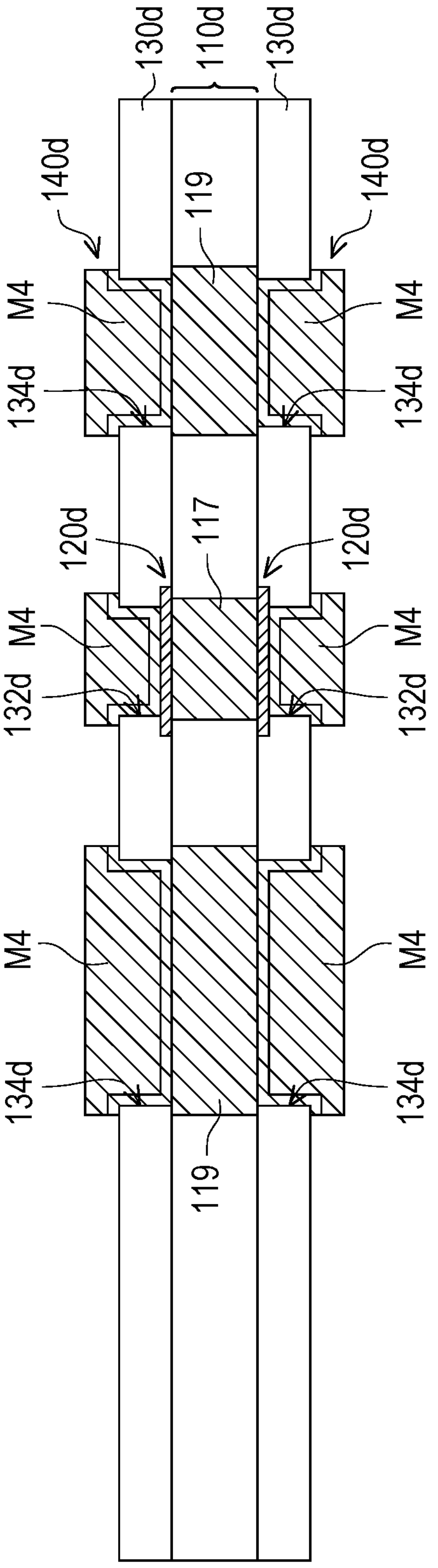

Next, referring to FIG. 4D and FIG. 4E, with the two patterned photoresist layers P4 as an electroplating mask, a metal material M4 (i.e., the first metal material) is electroplated on the two electroplating seed layers E3 exposed by the two patterned photoresist layers P4.

Next, referring to FIG. 4D and FIG. 4E, the two patterned photoresist layers P4 are removed to form two conductive metal layers 140*d* in the first openings 132*d* and the second openings 134*d*, correspondingly connected with the two electroplating metal layers 120*d* and the second metal portions 119, and extending to the two dielectric layers 130*d*.

Figure 4F:
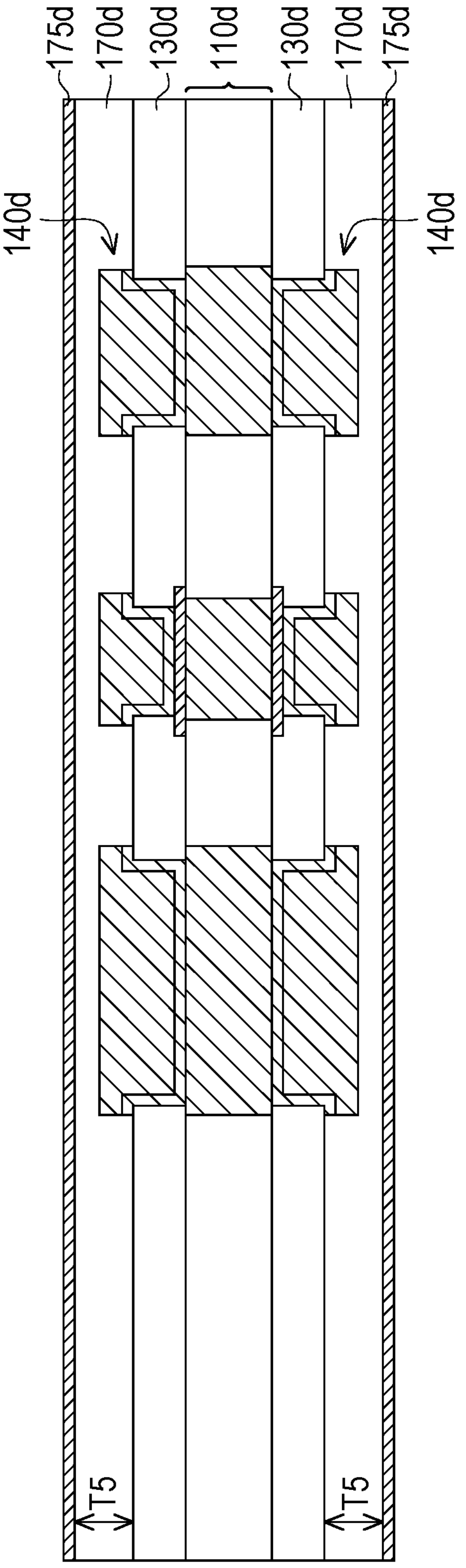

Next, referring to FIG. 4F, two build-up dielectric layers 170*d* and two copper foil layers 175*d* (i.e., the second copper foil layers) respectively located thereon are laminated on the two dielectric layers 130*d* and the two conductive metal layers 140*d*. The two build-up dielectric layers 170*d* cover the two dielectric layers 130*d* and the two conductive metal layers 140*d*. The thickness T5 of the build-up dielectric layers 170*d* is, for example, 50 μm or more and less than 300 μm. Here, the thickness T5 of the build-up dielectric layers 170*d* is, for example, 150 μm.

Figure 4G:
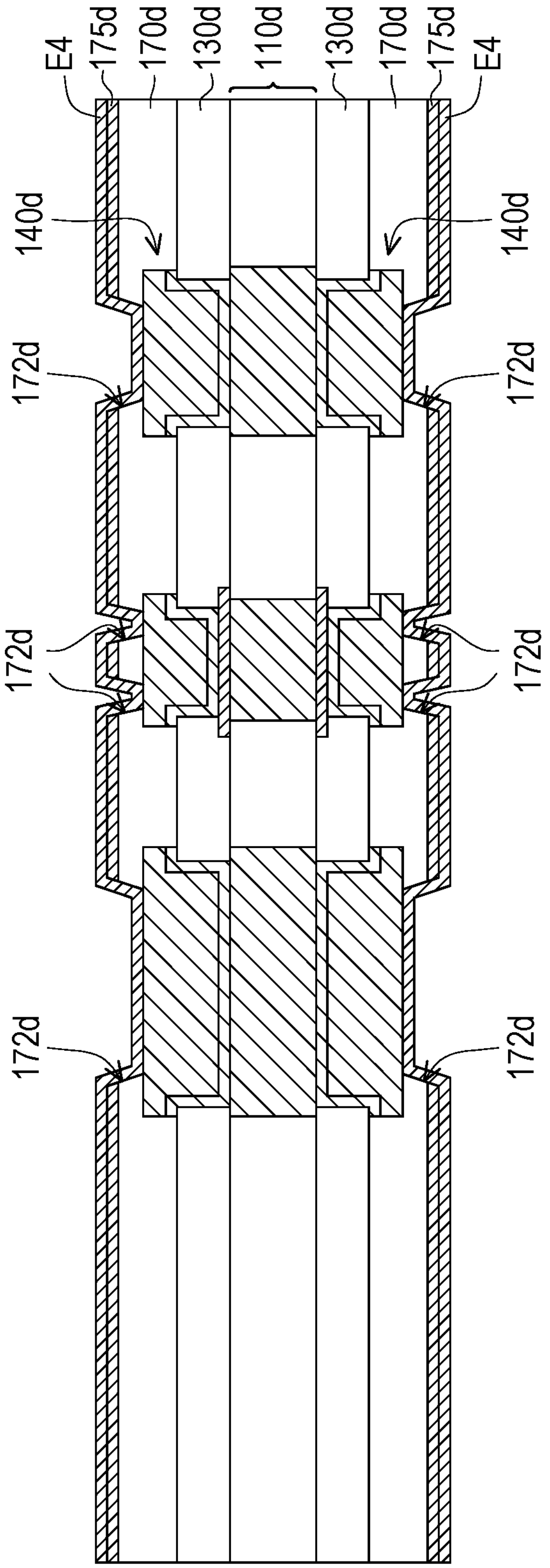

Next, referring to FIG. 4G, another drilling process is performed on the two build-up dielectric layers 170*d* and the two copper foil layers 175*d* respectively located thereon to form at least one third opening (a plurality of third openings 172*d* are schematically shown in the drawing). The third openings 172*d* expose portions of the two conductive metal layers 140*d*.

Next, referring to FIG. 4G again, two electroplating seed layers E4 (i.e., the second electroplating seed layers) are formed on the two copper foil layers 175*d* and in the third openings 172*d*.

Figure 4H:
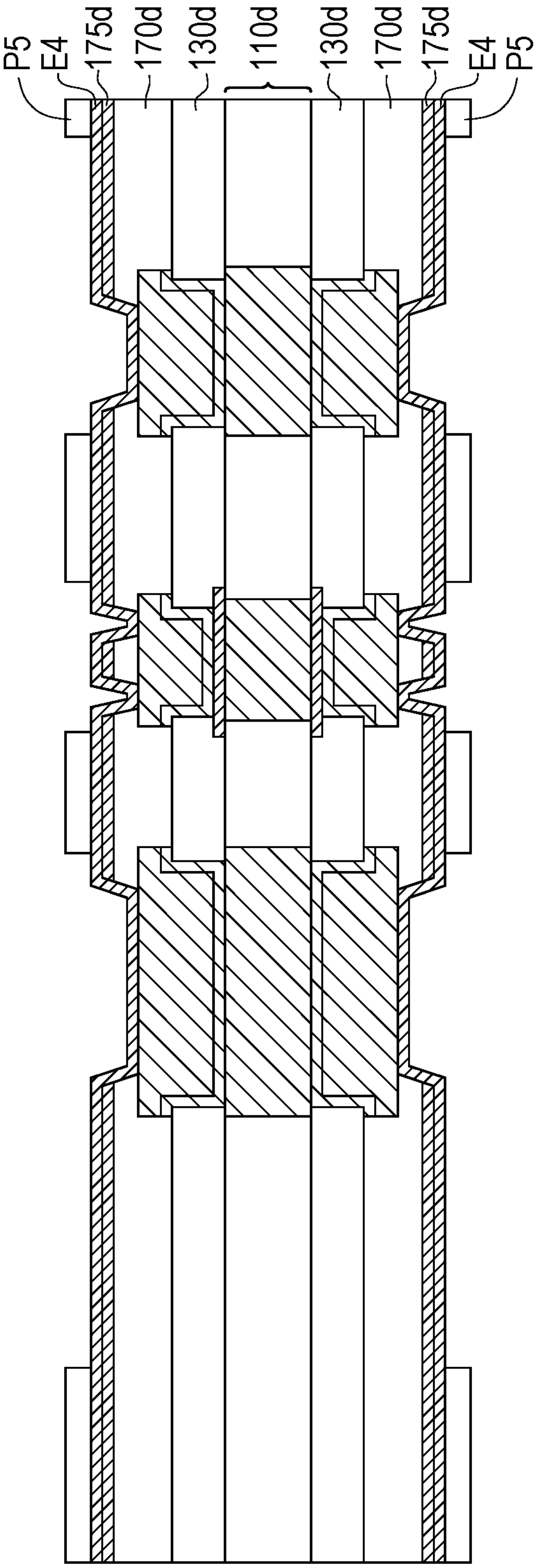

Next, referring to FIG. 4H, two patterned photoresist layers P5 (i.e., the second patterned photoresist layers) are formed on the two electroplating seed layers E4. The two patterned photoresist layers P5 expose portions of the two electroplating seed layers E4 located on the two copper foil layers 175*d* and portions of the two electroplating seed layers E4 located in the third openings 172*d*.

Figure 4I:
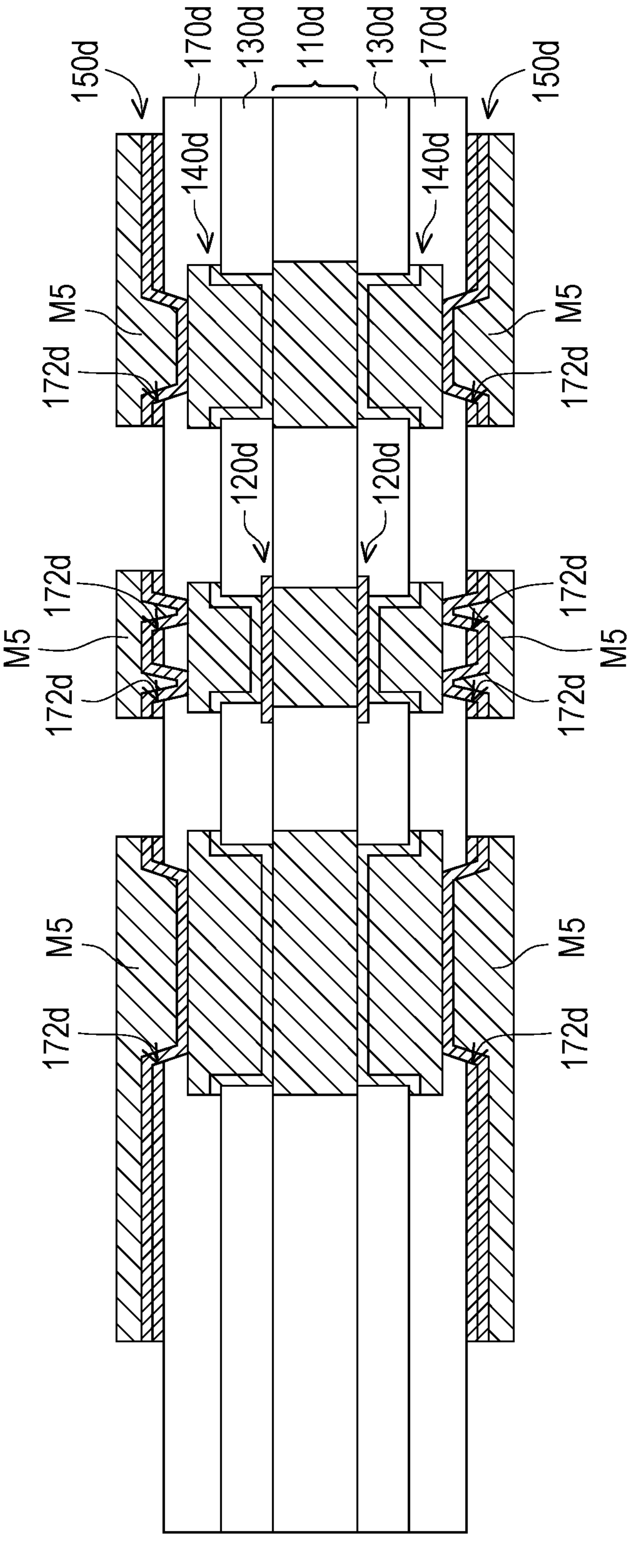

Next, referring to FIG. 4H and FIG. 4I, with the two patterned photoresist layers P5 as the electroplating mask, a metal material M5 (i.e., the second metal material) is electroplated on the two electroplating seed layers E4 exposed by the two patterned photoresist layers P5.

After that, referring to FIG. 4H and FIG. 4I, the two patterned photoresist layers P5 are removed to form two build-up metal layers 150*d* in the third openings 172*d*. The two build-up metal layers 150*d* are connected to the two conductive metal layers 140*d* and extend to the two build-up dielectric layers 170*d*.

Figure 4J:
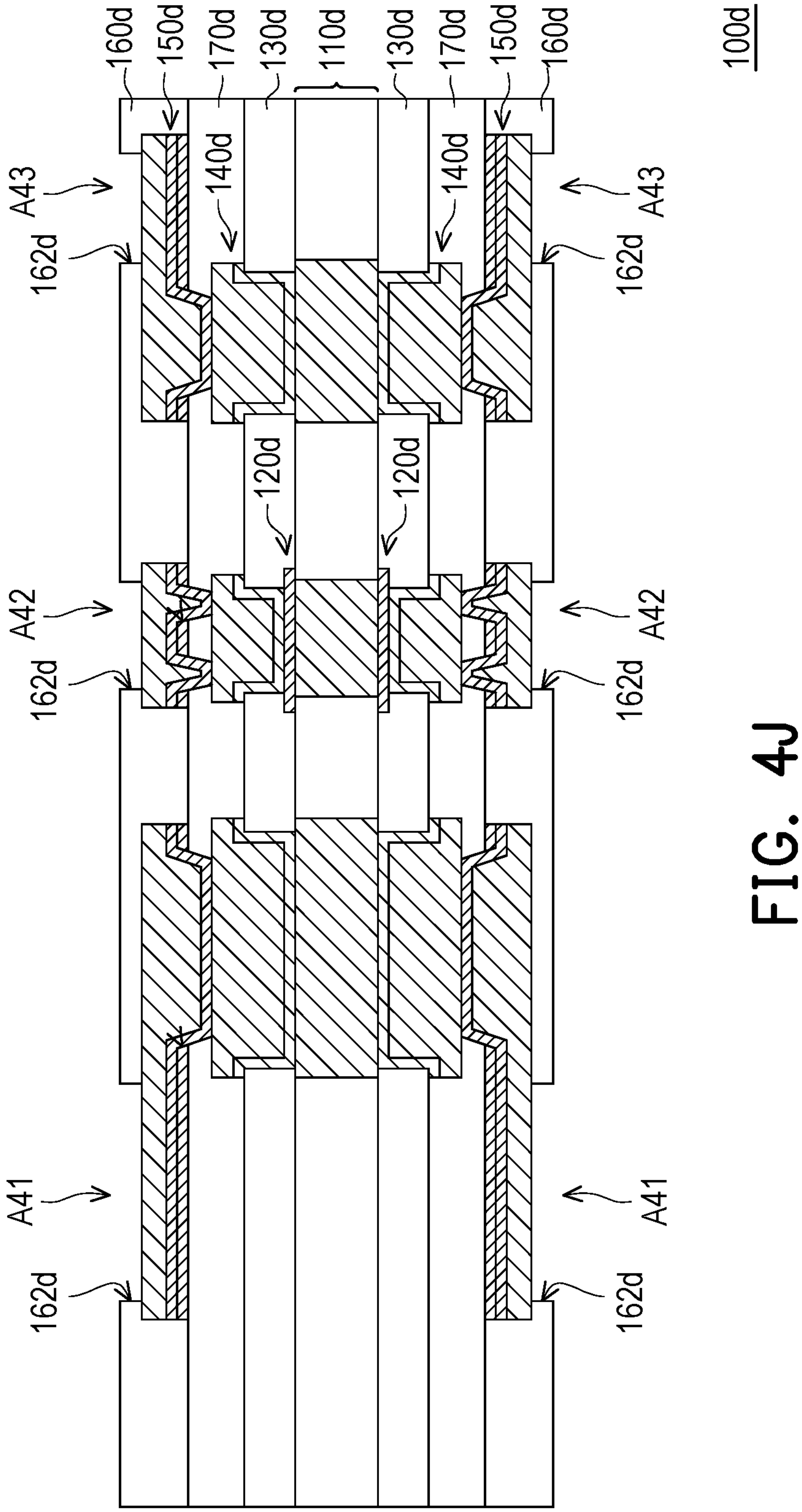

Finally, referring to FIG. 4J, two solder mask layers 160*d* are formed on the two build-up dielectric layers 170*d*. Each of the solder mask layers 160*d* has at least one solder mask opening (a plurality of solder mask openings 162*d* is schematically shown in the drawing), and the solder mask openings 162*d* expose portions of the build-up metal layers 150*d* to define at least one pad area (a plurality of pad areas A41, A42, and A43 are schematically shown in the drawing). At this point, the process of manufacturing the circuit board structure 100*d* has been completed. With regard to its structure, referring to FIG. 1O and FIG. 4J, the circuit board structure 100*d* in the present embodiment is similar to the circuit board structure 100*a* in FIG. 1O, and a main difference between the two embodiments is that the core layer 110*d* in the present embodiment is made of a copper foil substrate, and the metal portion is formed by electroplating. Therefore, the core layer 110*d* includes one dielectric portion 115 and a plurality of metal portions (i.e., the first metal portion 117 and the second metal portions 119).

In the present embodiment, the material of the first metal portion 117 and the second metal portions 119, the material of the electroplating metal layers 120*d*, the material of the conductive metal layers 140*d*, and the material of the build-up metal layers 150*d* may be, for example, copper. Through rapid electroplating, the electroplating metal layers 120*d* are connected to the first metal portion 117 of the core layer 110*d* (referring to FIG. 4E), and the conductive metal layers 140*d* are connected to the electroplating metal layers 120*d* and the second metal portions 119 (referring to FIG. 4E)), and the build-up metal layers 150*d* are connected to the conductive metal layers 140*d* (referring to FIG. 4J), thereby forming a metal area with a certain thickness, that is, forming a thick copper circuit board structure that may carry large currents, and having better process efficiency.

In summary, in the design of the circuit board structure of the disclosure, the electroplating metal layers are connected to the metal portion of the core layer, and the conductive metal layers are connected to the electroplating metal layers through the openings of the dielectric layers, thereby forming a metal area with a certain thickness that may carry large currents. In addition, since the circuit board structure of the disclosure forms the electroplating metal layers on the core layer through electroplating, time-consuming mechanical processing may be eliminated, and it is also feasible to manufacture only a single-sided circuit.

Although the disclosure has been described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A manufacturing method of a circuit board structure, comprising:

providing a core layer, the core layer has a first surface and a second surface opposite to each other and comprises at least one dielectric portion and at least one metal portion;

electroplating at least one electroplating metal layer on at least one of the first surface and the second surface of the core layer, the at least one electroplating metal layer exposes a portion of at least one of the first surface and the second surface and is at least connected to the at least one metal portion;

laminating at least one dielectric layer on at least one of the first surface and the second surface of the core layer and on the at least one electroplating metal layer;

performing a drilling process on the at least one dielectric layer to form at least one opening that exposes a portion of the at least one electroplating metal layer; and forming at least one conductive metal layer in the at least one opening of the at least one dielectric layer, and the at least one conductive metal layer is correspondingly connected to the at least one electroplating metal layer, wherein the at least one dielectric portion is a plurality of dielectric portions, and the at least one metal portion comprises a metal portion, and the step of providing the core layer comprises:

providing a copper plate having the first surface and the second surface, wherein a thickness of the copper plate is greater than or equal to 200 μm and less than or equal to 500 μm;

performing a first half etching process on the first surface of the copper plate to form a plurality of first cavities on the first surface;

filling a first dielectric paste in the first cavities;

performing a second half-etching process on the second surface of the copper plate to form a plurality of second cavities on the second surface and in communication with the first cavities to define the metal portion, wherein the second cavities expose the first dielectric paste; and filling a second dielectric paste in the second cavities, and the second dielectric paste is connected to the first dielectric paste to define the dielectric portions.

2. The manufacturing method of the circuit board structure according to claim 1, wherein the step of forming the at least one conductive metal layer in the at least one opening of the at least one dielectric layer comprises:

forming at least one electroplating seed layer on the at least one dielectric layer and in the at least one opening;

forming at least one first patterned photoresist layer on the at least one electroplating seed layer, the at least one first patterned photoresist layer exposes a portion of the at least one electroplating seed layer located in the at least one opening;

with the at least one first patterned photoresist layer as an electroplating mask, electroplating a first metal material on the at least one electroplating seed layer exposed by the at least one first patterned photoresist layer;

removing the at least one first patterned photoresist layer to expose the at least one electroplating seed layer and the first metal material;

forming at least one second patterned photoresist layer on the at least one electroplating seed layer, the at least one second patterned photoresist layer exposes the first metal material and a portion of the at least one electroplating seed layer;

with the at least one second patterned photoresist layer as an electroplating mask, electroplating a second metal material on the first metal material and the at least one electroplating seed layer exposed by the at least one second patterned photoresist layer; and removing the at least one second patterned photoresist layer and the at least one electroplating seed layer thereunder to expose the at least one dielectric layer and form at least one build-up metal layer and the at least one conductive metal layer that is in the at least one opening of the at least one dielectric layer and connected to the at least one build-up metal layer.

3. The manufacturing method of the circuit board structure according to claim 2, wherein a thickness of the at least one dielectric layer is greater than or equal to 50 μm and less than 300 μm.

4. The manufacturing method for the circuit board structure according to claim 2, further comprising:

forming at least one solder mask layer on the at least one dielectric layer, the at least one solder mask layer has at least one solder mask opening, and the at least one solder mask opening exposes a portion of the at least one build-up metal layer to define at least one pad area.

5. The manufacturing method of the circuit board structure according to claim 1, wherein the step of forming the at least one conductive metal layer in the at least one opening of the at least one dielectric layer comprises:

the at least one electroplating metal layer is two electroplating metal layers, and the at least one dielectric layer is two dielectric layers, each of the two dielectric layers has at least one opening, the at least one opening comprises a first opening and a second opening, the first opening exposes the two electroplating metal layers connected to at least one of the dielectric portions, and the second opening exposes the two electroplating metal layers connected to the metal portion;

forming two release films on the two dielectric layers, respectively, and the two release films expose portions of the two dielectric layers, respectively, and the first opening and the second opening;

filling a conductive paste layer on one of the two dielectric layers exposed by one of the two release films and in the corresponding first opening and the second opening, and on another one of the two dielectric layers exposed by another one of the two release films and in the corresponding first opening, so as to form two conductive metal layers, wherein one of the two conductive metal layers is disposed in the first opening and the second opening of one of the two dielectric layers and is connected to a corresponding one of the two electroplating metal layers, and another one of the two conductive metal layers is disposed in the first opening of another one of the two dielectric layers and connected to another corresponding one of the two electroplating metal layers; and removing the two release films to expose the two dielectric layers.

6. The manufacturing method of the circuit board structure according to claim 5, further comprising:

before removing the two release films, filling an electrically insulating and thermally conductive paste layer in the second opening of the another one of the two dielectric layers and connected to the another corresponding one of the two electroplating metal layers.

7. A manufacturing method of a circuit board structure, comprising:

providing a core layer, the core layer has a first surface and a second surface opposite to each other and comprises at least one dielectric portion and at least one metal portion;

electroplating at least one electroplating metal layer on at least one of the first surface and the second surface of the core layer, the at least one electroplating metal layer exposes a portion of at least one of the first surface and the second surface and is at least connected to the at least one metal portion;

laminating at least one dielectric layer on at least one of the first surface and the second surface of the core layer and on the at least one electroplating metal layer;

performing a drilling process on the at least one dielectric layer to form at least one opening that exposes a portion of the at least one electroplating metal layer; and forming at least one conductive metal layer in the at least one opening of the at least one dielectric layer, and the at least one conductive metal layer is correspondingly connected to the at least one electroplating metal layer, wherein the at least one dielectric portion is a dielectric portion, the at least one metal portion comprises a first metal portion and a second metal portion, and the at least one electroplating metal layer is connected to the first metal portion; and the manufacturing method of the circuit board structure further comprises:

laminating the at least one dielectric layer and at least one first copper foil layer thereon on at least one of the first surface and the second surface of the core layer and on the at least one electroplating metal layer;

performing a drilling process on the at least one dielectric layer and the at least one first copper foil layer thereon to form the at least one opening, the at least one opening comprises a first opening and a second opening, the first opening exposes a portion of the at least one electroplating metal layer, the second opening exposes a portion of the second metal portion;

forming at least one first electroplating seed layer on the at least one first copper foil layer and in the first opening and the second opening;

forming at least one first patterned photoresist layer on the at least one first electroplating seed layer, the at least one first patterned photoresist layer exposes a portion of the at least one first electroplating seed layer located on the at least one first copper foil layer and the at least one first electroplating seed layer located in the first opening and the second opening;

with the at least one first patterned photoresist layer as an electroplating mask, electroplating a first metal material on the at least one first electroplating seed layer exposed by the at least one first patterned photoresist layer; and removing the at least one first patterned photoresist layer to form the at least one conductive metal layer in the first opening and the second opening correspondingly connected to the at least one electroplating metal layer and the second metal portion, and extending to the at least one dielectric layer.

8. The manufacturing method of the circuit board structure according to claim 7, further comprising:

laminating at least one build-up dielectric layer and at least one second copper foil layer thereon on the at least one dielectric layer and the at least one conductive metal layer;

performing another drilling process on the at least one build-up dielectric layer and the at least one second copper foil layer thereon to form at least one third opening, and the at least one third opening exposes a portion of the at least one conductive metal layer;

forming at least one second electroplating seed layer on the at least one second copper foil layer and in the at least one third opening;

forming at least one second patterned photoresist layer on the at least one second electroplating seed layer, the at least one second patterned photoresist layer exposes a portion of the at least one second electroplating seed layer located on the at least one second copper foil layer and a portion of the at least one second electroplating seed layer located in the at least one third opening;

with the at least one second patterned photoresist layer as an electroplating mask, electroplating a second metal material on the at least one second electroplating seed layer exposed by the at least one second patterned photoresist layer; and removing the at least one second patterned photoresist layer to form at least one build-up metal layer in the at least one third opening, wherein the at least one build-up metal layer is connected to the at least one conductive metal layer and extends to the at least one build-up dielectric layer.

9. The manufacturing method of the circuit board structure according to claim 8, further comprising:

forming at least one solder mask layer on the at least one build-up dielectric layer, the at least one solder mask layer has at least one solder mask opening, and the at least one solder mask opening exposes a portion of the at least one build-up metal layer to define at least one pad area.

* * * * *